(12) United States Patent
Wallace et al.

(10) Patent No.: US 12,308,284 B2
(45) Date of Patent: May 20, 2025

(54) PLUG AND TRENCH ARCHITECTURES FOR INTEGRATED CIRCUITS AND METHODS OF MANUFACTURE

(71) Applicant: Intel Corporation, Santa Clara, CA (US)

(72) Inventors: Charles H. Wallace, Portland, OR (US); Marvin Y. Paik, Portland, OR (US); Hyunsoo Park, Portland, OR (US); Mohit K. Haran, Hillsboro, OR (US); Alexander F. Kaplan, Portland, OR (US); Ruth A. Brain, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 602 days.

(21) Appl. No.: 17/521,753

(22) Filed: Nov. 8, 2021

(65) Prior Publication Data

US 2022/0068707 A1    Mar. 3, 2022

Related U.S. Application Data

(62) Division of application No. 16/329,172, filed as application No. PCT/US2016/054799 on Sep. 30, 2016, now Pat. No. 11,171,043.

(51) Int. Cl.
*H01L 21/768* (2006.01)
*H01L 21/311* (2006.01)
(Continued)

(52) U.S. Cl.
CPC .. *H01L 21/76816* (2013.01); *H01L 21/31144* (2013.01); *H01L 21/76808* (2013.01);
(Continued)

(58) Field of Classification Search
CPC . H01L 23/522; H01L 23/528; H01L 23/5226; H01L 23/532; H01L 23/5329;
(Continued)

(56) References Cited

U.S. PATENT DOCUMENTS 11,668,115 B2    6/2023  Fournier et al.
2009/0242952 A1  10/2009 Heinrichsdorff et al.
(Continued)

FOREIGN PATENT DOCUMENTS

KR      100801065      2/2008
WO   WO 2015/047320 A1 *  4/2015  ......... H01L 21/3205

OTHER PUBLICATIONS

Ex Parte Quayle Action from U.S. Appl. No. 16/329,172 notified May 14, 2021, 9 pgs.
(Continued)

*Primary Examiner* — Chuong A Luu
(74) *Attorney, Agent, or Firm* — Essential Patents Group, LLP

(57) ABSTRACT

Methods and architectures for IC interconnect trenches, and trench plugs that define separations between two adjacent trench ends. Plugs and trenches may be defined through a multiple patterning process. An upper grating pattern may be summed with a plug keep pattern into a pattern accumulation layer. The pattern accumulation layer may be employed to define plug masks. A lower grating pattern may then be summed with the plug masks to define a pattern in a trench ILD material, which can then be backfilled with interconnect metallization. As such, a complex damascene interconnect structure can be fabricated at the scaled-down geometries achievable with pitch-splitting techniques. In some embodiments, the trenches are located at spaces between first spacer masks defined in a patterning process associated with the first grating pattern while the plug masks are located based
(Continued)

on a tone-inversion of second spacer masks associated with the second grating pattern.

19 Claims, 18 Drawing Sheets

(51) Int. Cl.
    *H01L 23/522* (2006.01)
    *H01L 23/528* (2006.01)
(52) U.S. Cl.
    CPC .... *H01L 21/76897* (2013.01); *H01L 23/5226* (2013.01); *H01L 23/528* (2013.01)
(58) Field of Classification Search
    CPC ............. H01L 23/53295; H01L 21/311; H01L 21/31144; H01L 21/768; H01L 21/76808; H01L 21/76816; H01L 21/76897; H01L 21/76801; H01L 21/76885; H01L 21/76837
    USPC ........................................................ 257/666
    See application file for complete search history.

(56) References Cited

U.S. PATENT DOCUMENTS

| | | |
|---|---|---|
| 2009/0261479 A1 | 10/2009 | Hong |
| 2012/0061807 A1 | 3/2012 | Tran |
| 2015/0171009 A1 | 6/2015 | Bristol et al. |
| 2015/0171010 A1 | 6/2015 | Bristol et al. |
| 2016/0197011 A1 | 7/2016 | Bristol et al. |

OTHER PUBLICATIONS

International Search Report and Written Opinion for International Patent Application No. PCT/US16/54799, mailed Jun. 30, 2017.
Notice of Allowance from U.S. Appl. No. 16/329,172 notified Jul. 22, 2021, 8 pgs.
International Preliminary Report on Patentability mailed Apr. 11, 2019 for PCT Patent Application No. PCT/US16/54799.
Restriction Requirement from U.S. Appl. No. 16/329,172 notified Feb. 10, 2021, 12 pgs.

* cited by examiner

PLUG AND TRENCH ARCHITECTURES FOR INTEGRATED CIRCUITS AND METHODS OF MANUFACTURE

CLAIM OF PRIORITY

This application is a divisional of, and claims the benefit of priority to, U.S. patent application Ser. No. 16/329,172, filed on Feb. 27, 2019 and titled "PLUG & TRENCH ARCHITECTURES FOR INTEGRATED CIRCUITS & METHODS OF MANUFACTURE," which is a National Stage Entry of, and claims the benefit of priority to, PCT Application No. PCT/US2016/054799, filed on Sep. 30, 2016 and titled "PLUG & TRENCH ARCHITECTURES FOR INTEGRATED CIRCUITS & METHODS OF MANUFACTURE," which is incorporated by reference in entirety.

BACKGROUND

Cell density in integrated circuits (ICs) continues to increase. Integrated circuits (e.g., microprocessors, chipset components, graphics chips, memory chips, optical chips, etc.) commonly include electrically conductive traces, separate layers of which are coupled together by vias. To date, conductive traces are typically formed in trenches defined by a lithographic process in which a photoresist layer may be spin-coated over a dielectric layer. The photoresist layer may be exposed to radiation through a patterned mask, and the exposed photoresist developed in order to form an opening. Next, an opening for the trench may be etched in the dielectric layer by using the photoresist layer as an etch mask. This opening is referred to as a trench. Finally, the trench may be back filled with one or more metals or other conductive materials to form a conductive trace embedded within the dielectric layer.

One measure of the size of a trace is the critical dimension (CD). One measure of the spacing of a set of traces is their pitch. In the past, the sizes and the spacing of traces have progressively decreased. However, when patterning extremely small conductive line ends having extremely small pitches with lithographic processes, several challenges present themselves, particularly when the pitches are ~70 nanometers (nm), or less, and/or when the critical dimensions of the line ends are ~35 nm, or less. One challenge is that the critical dimensions of the line ends generally tend to scale faster than the resolution capabilities of the lithographic scanners. Extremely small spaces between line ends for example may be below the resolution capabilities of even extreme ultraviolet (EUV) lithographic scanners. As a result, it is common now for multiple lithographic masks to be used in a multiple patterning process to form a conductive interconnect trace. Such multiple patterning processes can increase IC interconnect costs dramatically, making it the integration of such processes very important to final IC chip cost.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
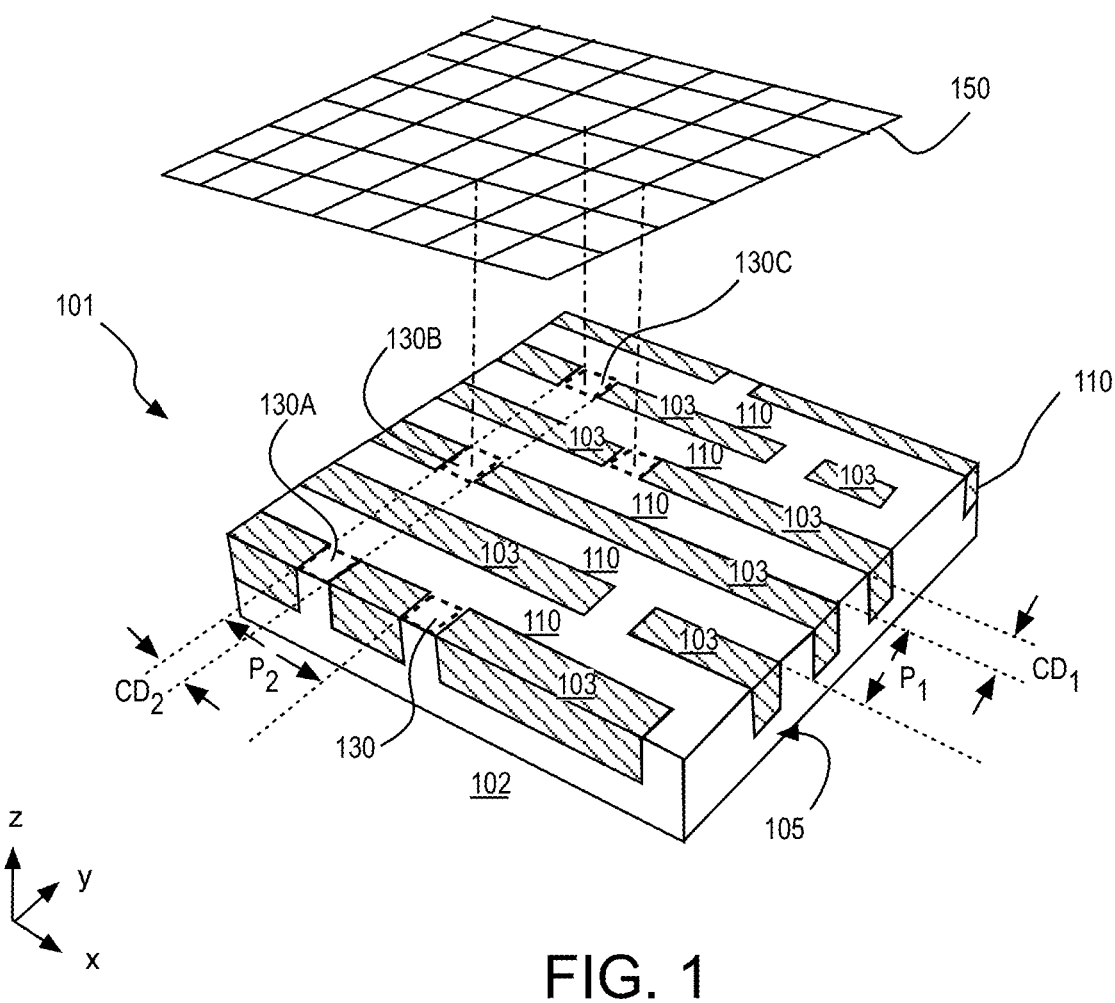
FIG. 1 is a perspective view of an IC interconnect structure including conductive traces separated by dielectric plugs, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Methods and architectures associated with metal trace or line plugs that define separations between two metal line ends are described below. The "plugs" are non-conductive (dielectric) spaces or interruptions between adjacent metals lines of a given interconnect level, which may also be referred to as "line ends," "pillars," "posts" or "cuts" in conductive traces that would otherwise be electrically continuous. As such, plugs are present in-plane, or in the same level, with a metal trace level. In accordance with some embodiments described further below, a lithographic plate or reticle that prints photoresist "backbone" lines in a photoresist at a given pitch (P) may be employed, for example with a pitch retaining patterning technique, or a pitch-splitting patterning technique, to define trench widths and spaces between trench lengths. Exemplary pitch-splitting techniques include pitch halving (P/2), or pitch quartering (P/4) hardmask patterning technique. The trenches are then backfilled with conductive material to form traces having pitches and widths that may be on a regular rectangular grid spacing. As such, a complex damascene-type structure can be fabricated at the scaled-down geometries achievable with pitch-splitting multiple patterning techniques. Some exemplary embodiments described below illustrate the use of one-dimensional (1D) grating mask structures. A grating mask is advantageously amenable to both direct patterning and pitch-splitting techniques (e.g., P/2 and P/4 patterning techniques), and may be further employed in conjunction with cross-grating (orthogonal) mask structures that are themselves likewise amenable to direct patterning and pitch-splitting techniques (e.g., P/2 and P/4 patterning techniques). The exemplary embodiments described below illustrate the fabrication of 2D conductive traces from such orthogonal 1D masking layers. One or more of these features may be practiced in accordance with embodiments further described herein to arrive at interconnect structures having one or more of the structural features described herein.

Some exemplary embodiments described below illustrate structural features indicative of fabrication processes applying the principles taught herein. Hence, while various mask structures described herein may be ephemeral, final structures in the IC that serve as a lasting fingerprint of the fabrication process are highlighted in the description below. For example, dielectric plugs fabricated as described below may have a substantially square footprint, which is indicative of the intersecting edges of etched polygons having been discretely defined by discrete orthogonal 1D grating masks. As such, the corner rounding typical of lithographically defined corners is substantially absent. Furthermore, at least one lateral dimension of the dielectric plugs may be defined by a film deposition process (e.g., atomic layer deposition) such that over an area of the IC, there may be less than 0.5 nm variation in the corresponding lateral dimension of the plugs. Furthermore, the width and/or pitch of the conductive traces may be constant in a first dimension, and the width and/or pitch of dielectric plugs separating ends of the conductive traces may also be constant in a second (e.g., orthogonal) dimension over an area of the IC. As such, the dielectric plugs within an area of the IC all fall on a regular rectangular grid array. In some such embodiments, where the width and pitch of the dielectric plugs in the second dimension are substantially equal to their width and pitch in the first dimension, the dielectric plugs within an IC area all fall on a regular square grid array.

FIG. 1 is a perspective view of an IC interconnect structure 101 that includes conductive traces 103 embedded in a trench ILD 101. Interconnect structure 101 may be disposed over a substrate 102 that further includes active devices, such as, but not limited to transistors (e.g., CMOS field effect transistors) that have terminals coupled to various traces 103. Within IC cell 101, traces 103 extend lengthwise in a first dimension (e.g., in x-dimension). Traces 103 may be of any conductive material, as embodiments herein are not limited in this context. For example, traces 103 may be a metal (e.g., Cu, Al, etc.), doped semiconductor (e.g., polysilicon, etc.), or the like. Traces 103 may form an array of any number of traces. In some embodiments, traces 103 include one or more pairs of conductive lines or traces having sidewalls separated by a portion of trench ILD 105 patterned into dielectric lines 110. The transverse width of traces 103 may vary with technology node. In some embodiments traces 103 have approximately 50 nanometer pitch, or less. The pitch of traces 103 may also be characterized as in terms of the pitch of dielectric lines 110. As shown in FIG. 1, dielectric lines 110 extend lengthwise in the first direction (e.g., in x-dimension) with the transverse width of dielectric lines 110 being equal to $CD_1$ and having a pitch equal to $P_1$. Dielectric lines 110 may have the same composition as trench ILD 105 disposed between traces 103. Dielectric lines 110 and/or trench ILD 105 may be any material known to provide sufficient electrical isolation between traces 103, such as, but not limited to SiC, SiN, SiCN, SiO, SiON, SiOC, HSQ, MSQ, or the like. For these compounds, the group IV constituent might also be replaced, (e.g., germanium nitrides, metal germanides, etc.). Various light and transition metal oxides (e.g., $AlO_x$, $HfO_x$, $ZrO_x$, $TiO_x$) and there silicates are also possible.

Top and sectional views of dielectric plugs 130 are further illustrated in perspective by FIG. 1. Plugs 130 are denoted in dashed line as spanning the width between adjacent dielectric lines 110 in the second direction (e.g., y-dimension). Hence, in this dimension, plugs 130 have a width equal to the transverse width of traces 103. This width may be substantially constant over an area of an IC occupied by interconnect structure 101. Likewise, in this dimension, plugs 130 have a pitch equal to, or a multiple of, the pitch of traces 103. In exemplary embodiments, traces 103 are parallel and a subset of plugs 130A, 130B, 130C form a line of plugs that is orthogonal to traces 103 (and to dielectric lines 110). Plugs 130 span a width between adjacent conductive traces 103 in the first direction (e.g., in the x-dimension) that is equal to $CD_2$. Although $CD_2$ may vary to different target values, all of plugs 130 within the area of an IC occupied by interconnect structure 101 may have substantially the same width $CD_2$ as this width is ultimately controlled by a film deposition thickness which may be controlled to an uniformity of tens-hundreds of angstroms over an entire wafer. As such, over the footprint of interconnect structure 101, $CD_2$ may vary by less than 0.1 nm and certainly less than 0.5 nm. In some advantageous embodiments, $CD_2$ is equal to $CD_1$ such that the width of plug 130 in the first direction (e.g. x-dimension) is equal to the width of dielectric lines 110 in the second dimension (e.g. y-dimension).

Adjacent plugs 130 in the first direction (e.g., in the x-dimension) have a pitch $P_2$. $P_2$ may vary to different target values relative to $CD_2$, controlling the second dimension of a regular rectangular grid spacing upon which plugs 130 all fall. In some further embodiments, pitch $P_2$ is equal to pitch $P_1$ such that the minimum pitch of plug 130 in the first direction (e.g., x-dimension) equal to the pitch of the dielectric lines 110 in the second dimension (e.g., in the y-dimension). For some embodiments where pitches $P_1$ and $P_2$ are equal and widths $CD_2$ and $CD_1$ equal, dielectric plugs 130 all fall on a regular square grid. As further shown in FIG. 1, the dot-dashed lines illustrate z-dimensional projections from the center point of plugs 130 intersecting nodes of square grid 150, which may, for example, be spaced apart by ½ $P_1$ (or $P_2$). In some further embodiments, each plug 130 has a substantially square footprint within cell 101, for example with $CD_2$ and $CD_1$ both being equal to ½ of $P_1$ and ½ of $P_2$. In those embodiments, a trace of minimum length will also have a square footprint of ½ $P_1$ by ½ $P_2$, equal to the lateral dielectric plug dimensions.

In some embodiments, plugs 130 are of a dielectric material composition that is distinct from that of dielectric lines 110. For such embodiments, dielectric plug material interfaces will be coincident with the dashed plug lines shown in FIG. 1. In some other embodiments where plugs 130 are of a dielectric material composition that is the same as that of dielectric lines 110, a material interface may still be coincident with the dashed plug lines in FIG. 1, but such an interface may merely be a discontinuity in microstructure rather than a compositional discontinuity. In still some other embodiments where plugs 130 are of a same dielectric material layer as that of dielectric lines 110, there may be no material or microstructural interface (i.e., a homogenous material). In that situation, only the geometry and locations of plugs 130 (relative to traces 103 and dielectric lines 110) may be indicative of the fabrication process.

Figure 2A:
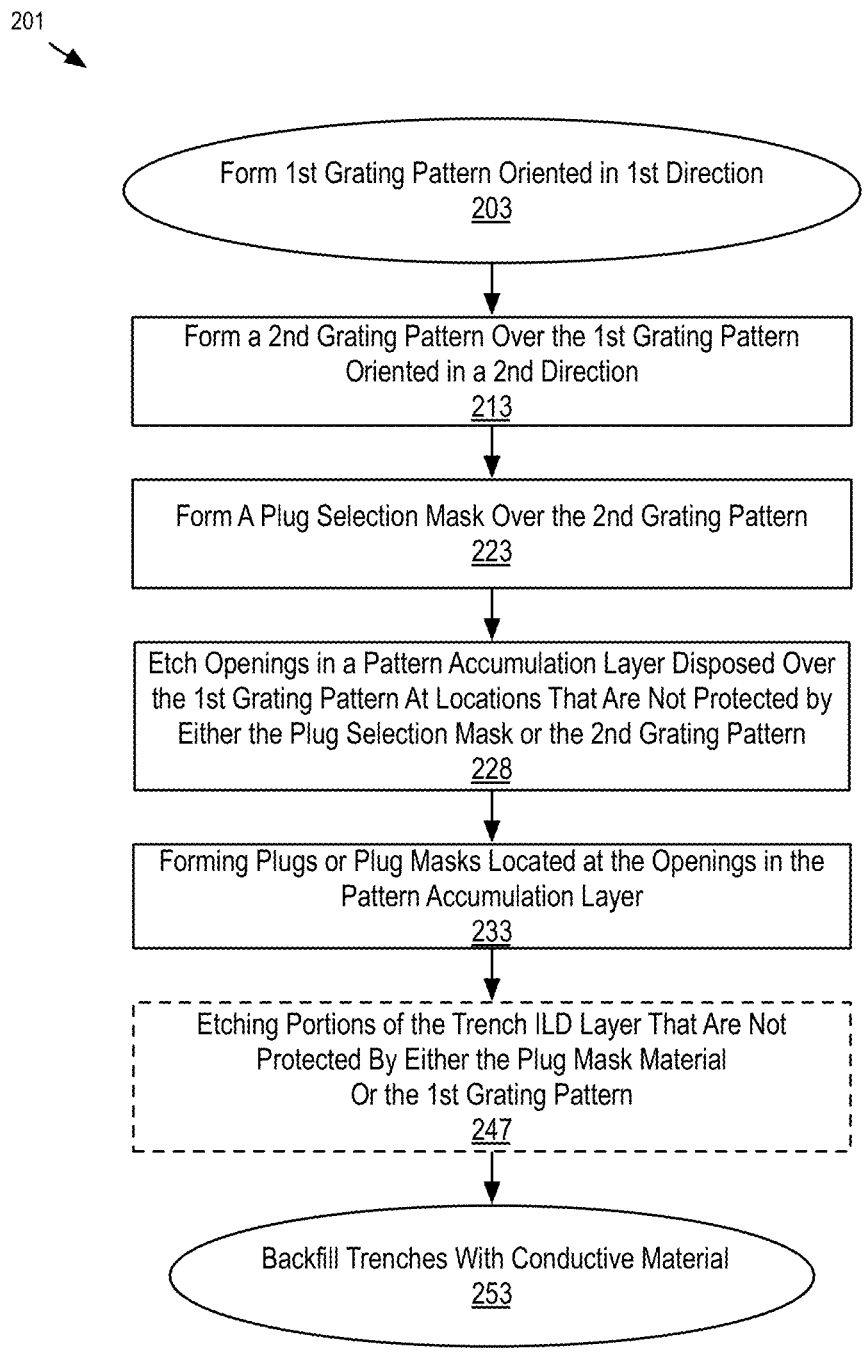
FIG. 2A is flow diagram illustrating dielectric plug and conductive trace formation, in accordance with some embodiments.

FIG. 2A is flow diagram illustrating methods 201 for dielectric plug and conductive trace fabrication, in accordance with some embodiments. Methods 201 begin at operation 203 where a first grating pattern oriented in a first direction is formed over an underlying substrate layer. In some embodiments, the substrate layer is a trench ILD layer. In other embodiments, the first grating pattern is the trench ILD layer. The first grating pattern may include pairs of parallel first dielectric lines extending lengthwise in a first direction, with spaces there between. The first grating pattern may be fabricated, for example, by printing a backbone pattern lithographically and forming spacer lines along a sidewall of the backbone pattern in a pitch splitting (e.g., pitch halving) patterning process. The spacer lines may then be the first dielectric lines, or the spacer lines may be translated by anisotropic etch into an underlying dielectric layer to form the first dielectric lines of the first grating pattern. Such spacer lines may have lateral dimensions tightly controlled as a function of the film deposition process.

At operation 213, a second grating pattern oriented in a second direction crossing the first direction is formed over the first grating pattern. The second grating pattern may include pairs of parallel second dielectric lines extending lengthwise in the second direction, with spaces there between. In some exemplary embodiments, the second direction is orthogonal to the first direction. The second grating pattern may be fabricated, for example, by printing a second backbone pattern lithographically and forming spacer lines along a sidewall of the backbone pattern in a pitch splitting (e.g., pitch halving) patterning process. The spacer lines may then be backfilled with a mask backfill material. The spacer lines may be removed as sacrificial mandrels, leaving the mask backfill material and the second backbone pattern comprising lines separated by spaces with lateral dimensions tightly controlled as a function of the spacer deposition process. The mask backfill material and second backbone pattern may be the second dielectric lines, or the backfill material and second backbone pattern may be translated by anisotropic etch into an underlying dielectric layer to form the second dielectric lines of the second grating pattern.

At operation 223, a plug selection mask is formed over the second dielectric lines. The plug selection mask may comprise polygons of any shape and need not also be a grating pattern. The plug selection mask features may have a minimum dimension that is as large as the total width of an adjacent pair of the second dielectric lines added to the intervening space between, for example.

At operation 228, openings are etching into a pattern accumulation layer disposed over the first dielectric lines at locations that are not protected by either the plug selection mask or the second dielectric lines. Hence, the etching operation 228 may translate openings in the summation of the plug selection mask and the second grating pattern into the underlying pattern accumulation layer. Following operation 228, the pattern accumulation layer may remain only in regions underlying the second dielectric lines, as well as in regions underlying the plug selection mask.

At operation 233, dielectric plugs or plug masks are formed at locations of the openings in the pattern accumulation layer. For embodiments where the first grating pattern is the trench ILD layer, dielectric plugs formed at operation 233 may backfill spaces between the first dielectric lines to define separate trench lengths. For embodiments where the first grating pattern is disposed over the trench ILD layer, trenches may be etched at operation 247 into an underlying layer at locations that are not protected by either the plug masks formed at operation 233 or the first dielectric lines formed at operation 203. In some embodiments, etching operation 247 etches recesses the trench ILD layer.

In some alternative embodiments, a second pattern accumulation layer is etched at operation 247, which is then employed as another pattern accumulation mask that is translated into an underlying trench ILD layer during a subsequent anisotropic etch. At operation 247, ILD material disposed within the space between the first mask lines is etched, for example after the second and third mask features have been removed. The trench etch process may include removing the first ILD material, leaving the plug dielectric and the ILD material that was under the first ILD material. The trench etch process may further recess the ILD material, concurrently recessing the plug dielectric material and thereby translate the plug shape into the underlying ILD material.

At operation 253, the trenches defined at operation 233, or 247, are backfilled with conductive material, which may then be planarized with surrounding ILD. The surrounding ILD may either comprise only the trench ILD layer, or may further include dielectric plug material of a distinct composition. For dual-damascene embodiments, vias may be patterned before or after delineation of the trenches prior to metallization operation 253 following any techniques compatible with methods 201.

Figure 2B:
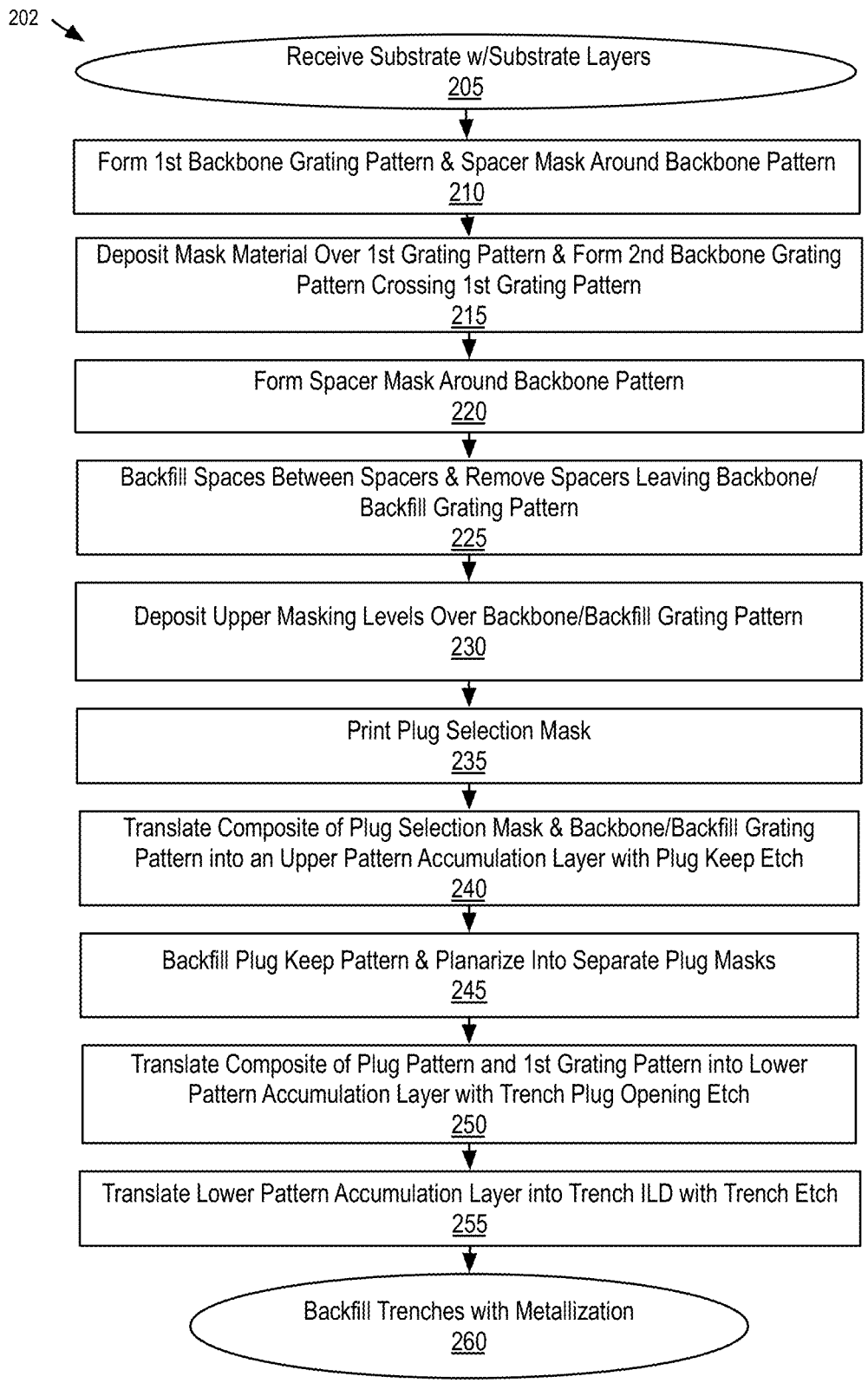
FIG. 2B is flow diagram illustrating dielectric plug and conductive trace formation, in accordance with some embodiments of the methods illustrated in FIG. 2A.

FIG. 2B is flow diagram illustrating methods 202 for fabricating dielectric plugs and conductive traces, in accordance with some embodiments of methods 201. FIGS. 3, 4, 5, 6, 7, 8, 9, 10, 11, 12, 13, 14, 15, 16, 17, 18, 19, 20, 21, 22, 23, 24, 25, 26, and 27 illustrate perspective cross-sectional views of an interconnect structure after selected operations of the methods 202 are performed, in accordance with some embodiments.

Referring first to FIG. 2B, methods 202 begin at operation 205 where a substrate with one or more substrate layers is received. The substrate may be any known IC substrate as embodiments herein are not limited in this respect. In some examples, the substrate received at operation 205 is a semiconductor wafer including a plurality of active device structures fabricated upstream of methods 202. For example, the substrate received may include a plurality of FETs (e.g., silicon CMOS FETS) fabricated in one or more substrate layers. The substrate layers may include one or more trench ILD layers that methods 202 are to pattern and backfill with metallization. For such embodiments, methods 202 entail multiple sacrificial mask material depositions and patterning processes to arrive at a final mask that is translated into the trench ILD layer of the received substrate. Alternatively, methods 202 may be employed to deposit and pattern the one or more trench ILD layer(s) over the received substrate. For such embodiments, methods 202 entail both depositions of sacrificial mask material and depositions of permanent ILD material that is retained in an IC interconnect structure.

Over the substrate layer(s), a first grating pattern is to be formed. In some embodiments, this first grating pattern is fabricated with a pitch splitting process. For example, an initial grating backbone pattern may be lithographically printed at operation 210 with a pitch $P_1'$ and then translated through a pitch splitting process (e.g., pitch halving or pitch quartering) to arrive at a first grating pattern having the desired reduction in pitch and or line critical dimension. In the example further illustrated in FIG. 3, lower-level masking material 305 includes a plurality of first masking material layers disposed over trench ILD 105. Trench ILD 105 may be of any material composition known to be suitable insulating conductive traces in an IC, as embodiments herein are not limited in this respect. In some examples, trench ILD 105 is SiO or SiOC. However, trench ILD 105 may alternatively be one of SiC, SiON, SiN, SiCN, HSQ, MSQ, or the like. Trench ILD 105 may have any thickness. In some embodiments, the thickness of trench ILD 105 is selected to host a conductive trace of a desired z-thickness. Lower-level masking material 305 includes a stack of (hard)mask materials 310, 315, 320, and 325 disposed over trench ILD 105. Mask materials 310-325 may each be a dielectric material having a composition distinct from those of the layers each interfaces. For example, mask material 315 is of different composition that mask material 310 and 320, while mask materials 310 and 315 may have the same composition, or different compositions. In some further embodiments, the mask materials 310-325 are all formed by spin-on processes, chemical vapor deposition (CVD), atomic layer deposition (ALD), or a similarly low-temperature deposition process (i.e., below 450° C. Mask materials 310-325 may be any of SiN, SiNC, SiC, SiON, SiO, SiOC, HSQ, MSQ, Si, Ge, Ti, TiN, HfOx, ZrOx, AlOx, TiOx, or metal silicate, for example. One or more of mask materials 310-325 may also be DLC, Si-DLC, or any other known carbon-hardmask (CHM) or spin-on-carbon (SOC) composition, for example.

Figure 3:
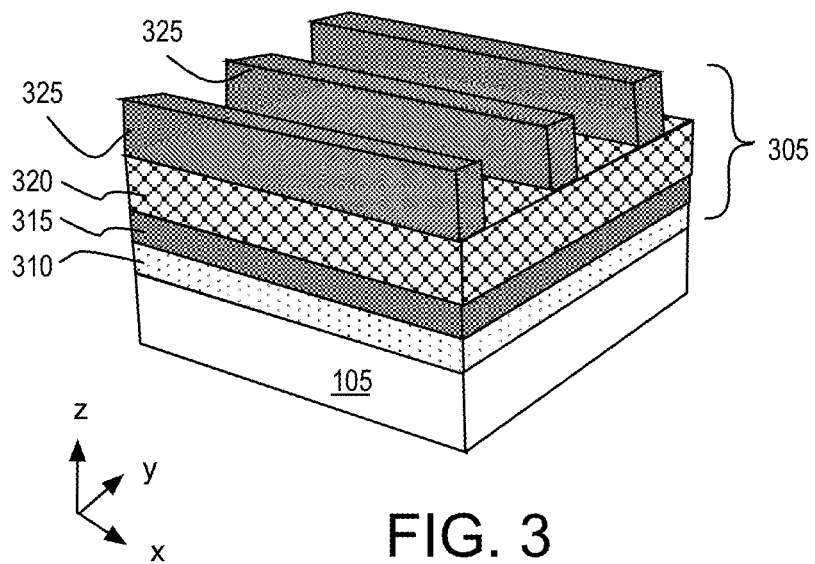
FIGS. 3, 4, 5, 6, 7, 8, 9, 10, 11, 12, 13, 14, 15, 16, 17, 18, 19, 20, 21, 22, 23, 24, 25, 26 and 27 are perspective cross-sectional views of an IC interconnect structure after selected operations in the methods illustrated in FIG. 2B are performed, in accordance with some embodiments.
Figure 4:
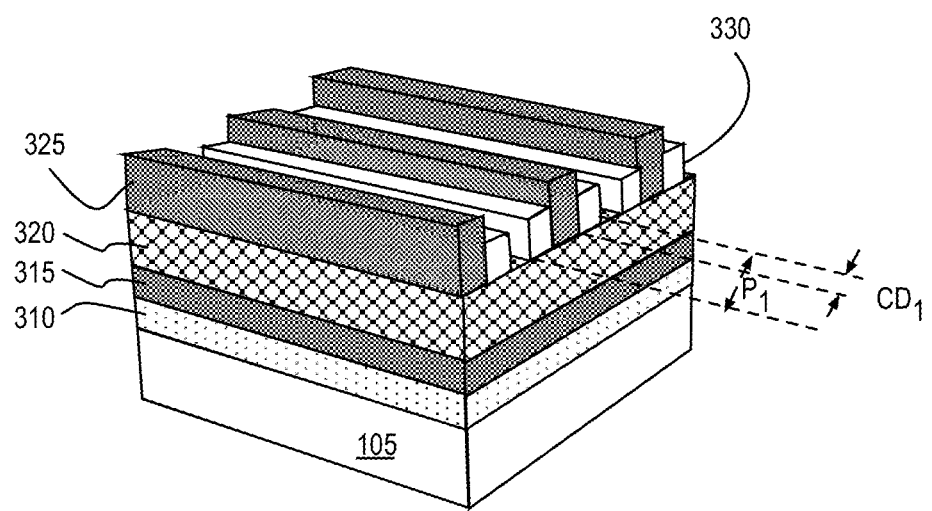
Figure 5:
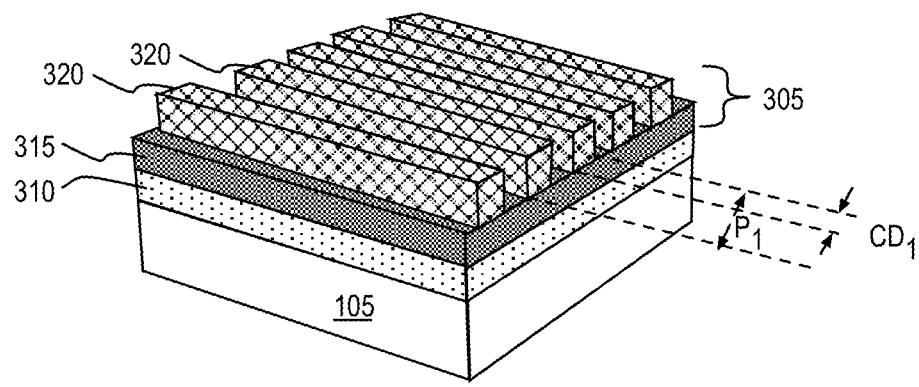
Figure 6:
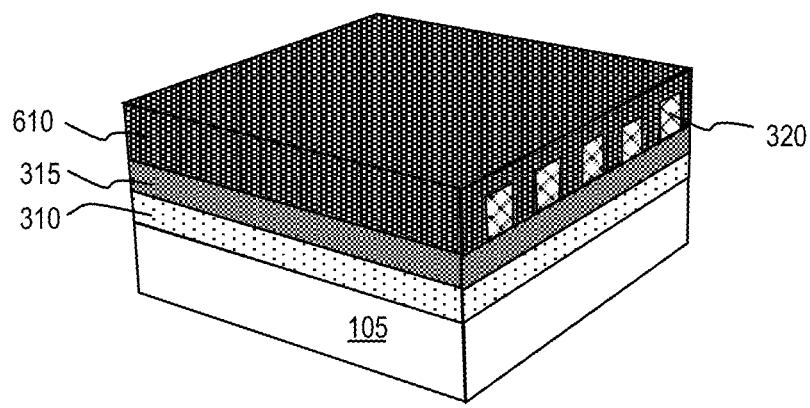

As shown in FIG. 3, mask material 325 is patterned into a first backbone grating pattern including pairs of lines extending lengthwise in a first direction (e.g., x-dimension). The backbone lines may have been printed at a pitch PC. Mask material 325 may have been patterned in any known manner, for example by etching mask material 325 with an anisotropic etching process to translate an overlying photosensitive masking layer (not depicted) that was lithographically printed with the first grating backbone pattern. Such a photosensitive layer may be stripped after the anisotropic etching process to arrive at the first backbone grating pattern illustrated in FIG. 3. The backbone grating patterning etch may stop on mask material 320 as a result of composition-based etch selectivity. The pitch splitting process continues with forming a spacer mask around the backbone grating pattern. Spacer mask formation may proceed in any known manner, for example, by depositing a dielectric spacer material conformally over the first backbone grating pattern, and then employing an anisotropic etch to remove the dielectric spacer material in all regions except for along sidewalls of the first backbone grating pattern. Following such a process, spacer lines 330 may be substantially as shown in FIG. 4. In the illustrated example, spacer lines 330 have pitch $P_1$ and a transverse width of $CD_1$. The backbone grating pattern may then be stripped selectively to spacer lines 330 and mask material 320. The spacer lines 330 are then employed as a mask that is translated into mask material 320, for example by anisotropic etch. Following such a patterned etch, spacer lines 330 may be stripped to arrive at the structure depicted in FIG. 5. As shown, the first grating pattern includes lines of mask material 320 at pitch $P_1$ and $CD_1$. Critical dimensions of this first grating pattern may vary with technology node. In some embodiments, lines of the first grating pattern have approximately 50 nanometer pitch, or less. In this exemplary embodiment, the first grating pattern is formed within lower-level mask material 305. In alternate embodiments however, the first grating pattern may be fabricated directly into trench ILD layer 310 in substantially the same manner such that the first grating pattern is not in a sacrificial mask material, but rather in a permanent material of the IC interconnect structure.

Methods 202 then proceed to operation 215, where intermediate level masking material is deposited over the lower-level masking material. The intermediate level masking material will be employed to form a second grating pattern crossing the first grating pattern. This second grating pattern may be formed in a manner similar to that employed to form the first grating pattern. For example, a multi-layer masking material stack may be deposited over the first grating pattern and then a lithographically patterned grating mask translated into the intermediate masking materials with a pitch splitting process to arrive at a second grating pattern having the desired reduction in pitch and or line critical dimension. In the example further illustrated in FIG. 6, mask material 610 is deposited over the first grating pattern, backfilling spaces between the lines of mask material 320. Mask material 610 is advantageously of a composition different than that of mask material 320 so that it can be subsequently removed selectively. In some embodiments, where mask material 320 is an oxide, nitride, oxynitride, or carbide, mask material 610 is a predominantly carbon, such as DLC, Si-DLC, or any other known CHM or SOC composition. Mask material 610 may be planarized as a result of the deposition process (e.g., for spin-on embodiments) or planarized by chemical-mechanical polish (CMP) after deposition (e.g., for CVD/ALD embodiments).

Figure 7:
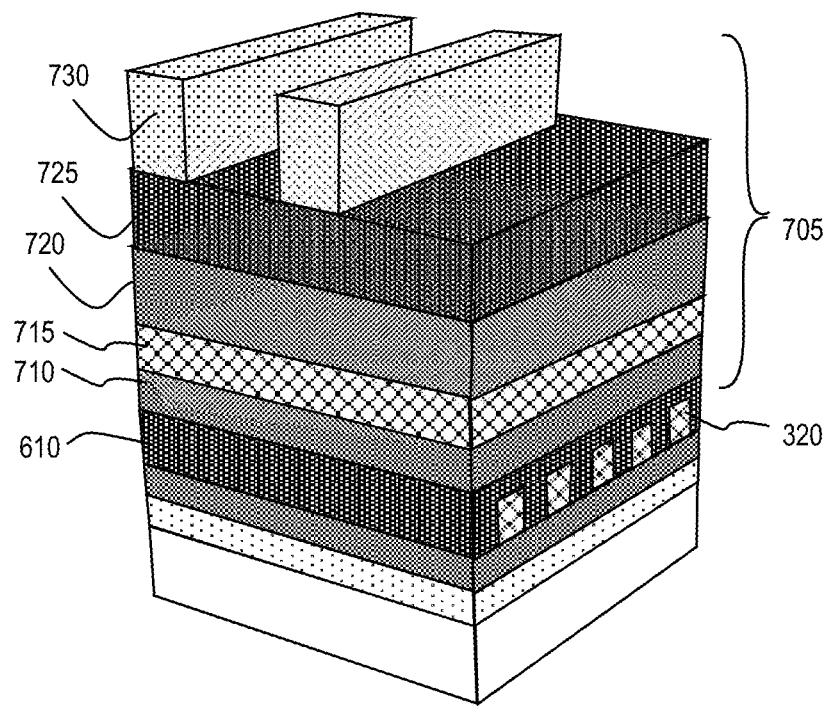

The intermediate masking material may further include one or more additional masking material layers to implement a pitch-splitting patterning process. For example, as shown in FIG. 7, intermediate-level masking material 705 includes a stack of (hard)mask materials 710, 715, 720, and 725 disposed over mask material 610. Mask materials 710-725 may each be a dielectric material having a composition distinct from those of the layers each interfaces. For example, mask material 715 is of different composition that mask material 710 and 720, while ask material 710 and 715 may have the same composition, or different compositions. Mask materials 710-725 may be any of SiN, SiNC, SiC, SiON, SiO, SiOC, HSQ, MSQ, Si, Ge, Ti, TiN, HfOx, ZrOx, AlOx, TiOx, or metal silicate, for example. One or more of mask materials 710-725 may also be DLC, Si-DLC, or any other known CHM or SOC composition, for example. In some further embodiments, the material layers 710-725 are all formed by spin-on, CVD, ALD, or other low-temperature deposition process.

Figure 8:
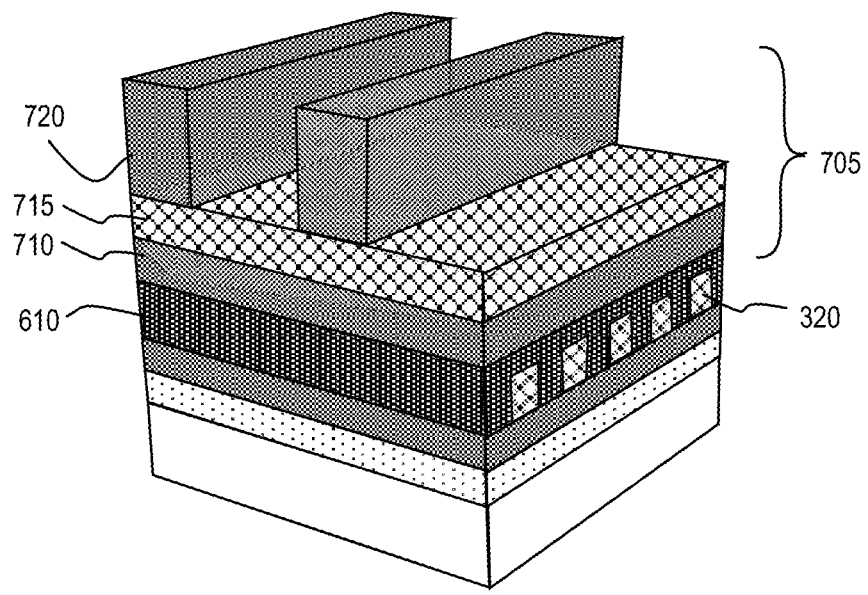

As further shown in FIG. 7, a photosensitive mask material 730 (e.g., photoresist) is lithographically patterned into a second backbone grating pattern including pairs of lines extending lengthwise in a second direction non-parallel to, and advantageously orthogonal to, the first grating direction (e.g., y-dimension). The backbone lines may have a printed pitch $P_2'$. As shown in FIG. 8, the second backbone grating pattern is translated by an anisotropic etching process into mask material 720. The backbone grating patterning etch may stop on mask material 715 as a result of composition-based etch selectivity. Photosensitive mask layer 730, as well as any other sacrificial mask material layer 725 (e.g., antireflective coatings, adhesion layers, or interfacial layers), is stripped after the etching process to arrive at the second backbone grating pattern illustrated in FIG. 8.

Figure 9:
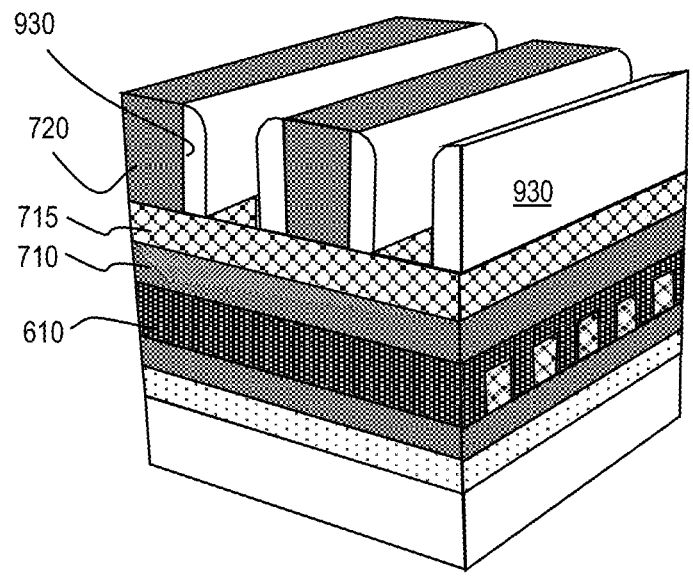
Figure 10:
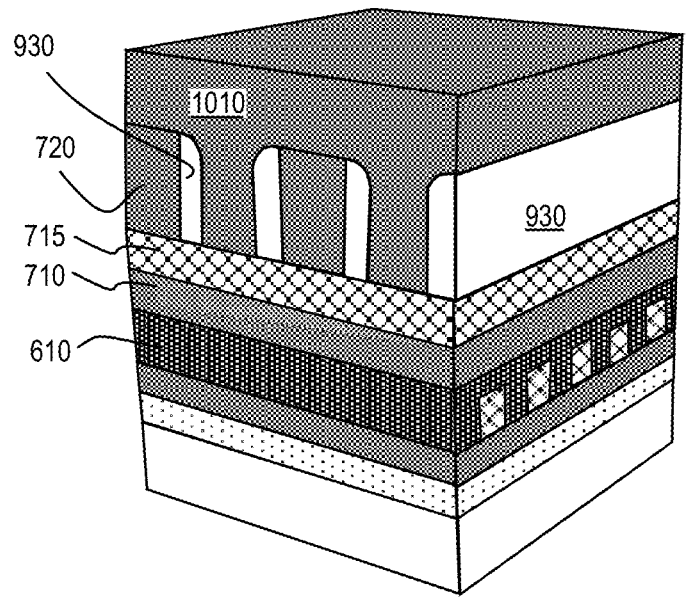

Returning to FIG. 2B, methods 202 continue the pitch-splitting process at operation 220 where a spacer mask is again form around the backbone grating pattern. Spacer mask formation may proceed in any known manner, for example, by depositing a dielectric spacer material conformally over the first backbone grating pattern, and then employing an anisotropic etch to remove the dielectric spacer material in all regions except for along sidewalls of the (second) backbone grating pattern to arrive at spacer lines 930 be substantially as shown in FIG. 9. As described further below, spacer lines 930 will be employed as mandrels, around which mask material is backfilled to invert the tone of the pattern defined by spacer lines 930 (i.e., swapping lines for spaces and vice versa).

Figure 11:
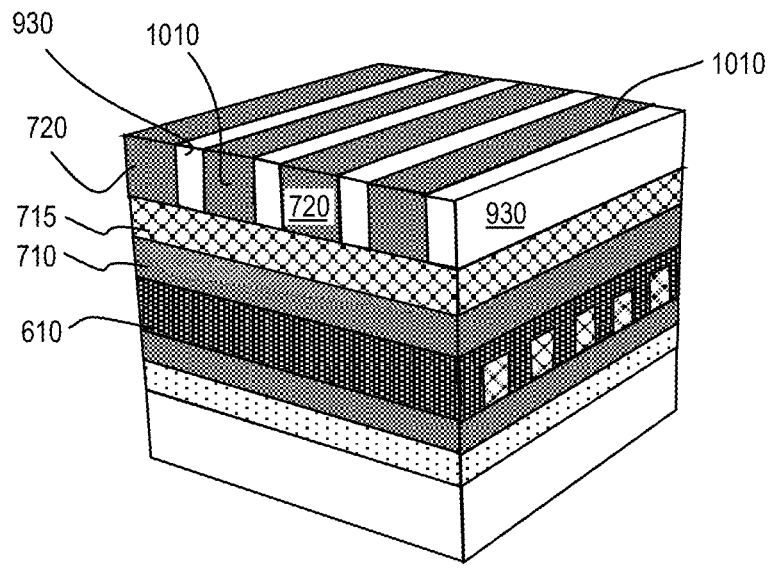
Figure 12:
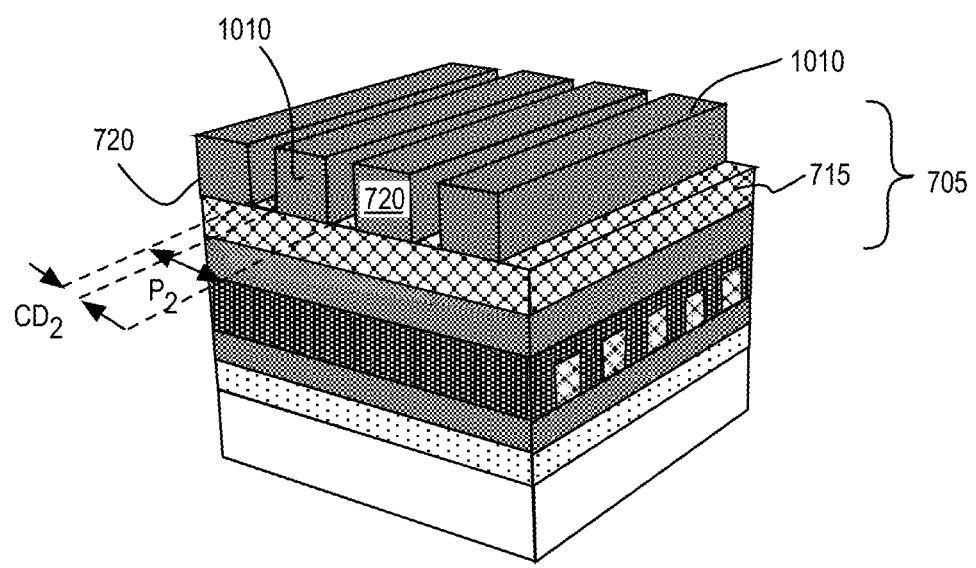

Methods 202 continue with tone inversion operation 225 in which spaces between the spacer lines are backfilled with another mask material. The mandrel spacer lines are then removed selectively to the resulting backbone and backfill pattern, the summation of which is to serve as the basis for the second grating pattern. As further illustrated in FIG. 10 for example, a mask backfill material 1010 backfills spaces between spacer lines 930. Mask backfill material 1010 may be any of SiN, SiNC, SiC, SiON, SiO, SiOC, HSQ, MSQ, Si, Ge, Ti, TiN, HfOx, ZrOx, AlOx, TiOx, or metal silicate, or any known CHM/SOC composition, for example. In some embodiments, mask backfill material 1010 is deposited by CVD, ALD, spin-on, or other low-temperature deposition process. As depicted in FIG. 11, mask backfill material 1010 is then recessed, for example by blanket etch or CMP, to expose spacer lines 930, as well as the backbone grating pattern in mask material 720. Once exposed, spacer lines 930 are removed as sacrificial mandrels. Spacer lines 930 may be removed selectively to retain mask backfill material 1010 and mask material 720 as the tone inversion of the scaled grating. As shown in FIG. 12, the resulting second grating pattern is a summation of mask backfill material 1010 and mask material 720 that includes lines extending in the second direction (e.g., y-dimension) and having a reduced pitch $P_2$ and a line spacing width of $CD_2$.

Figure 13:
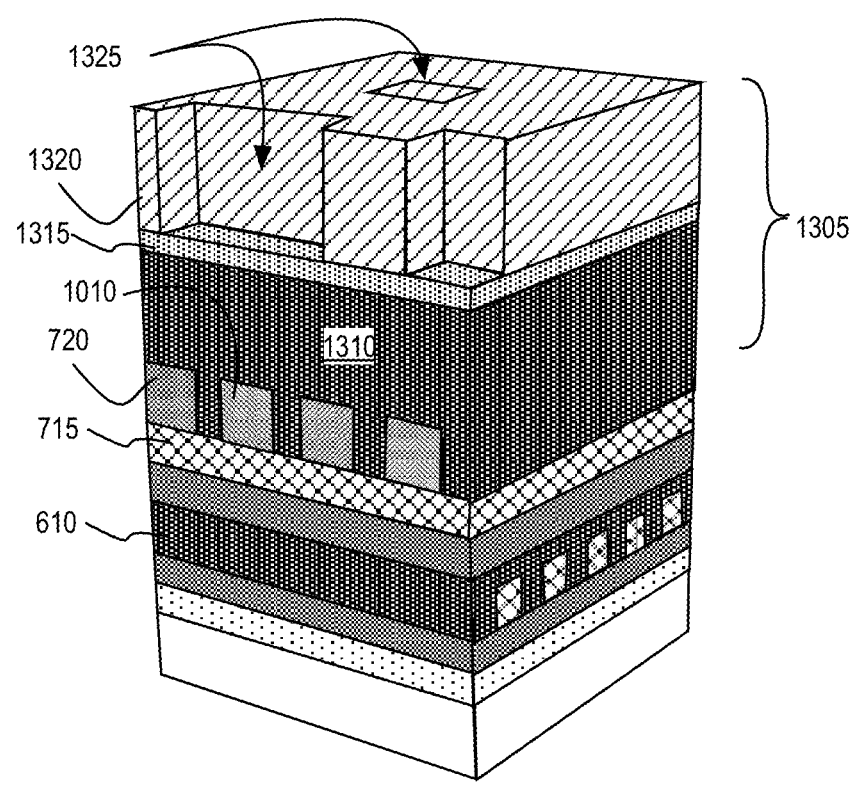
Figure 14:
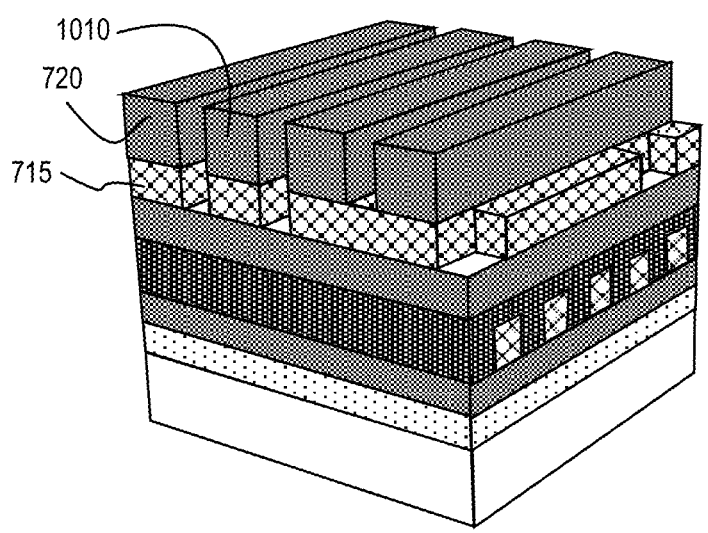
Figure 15:
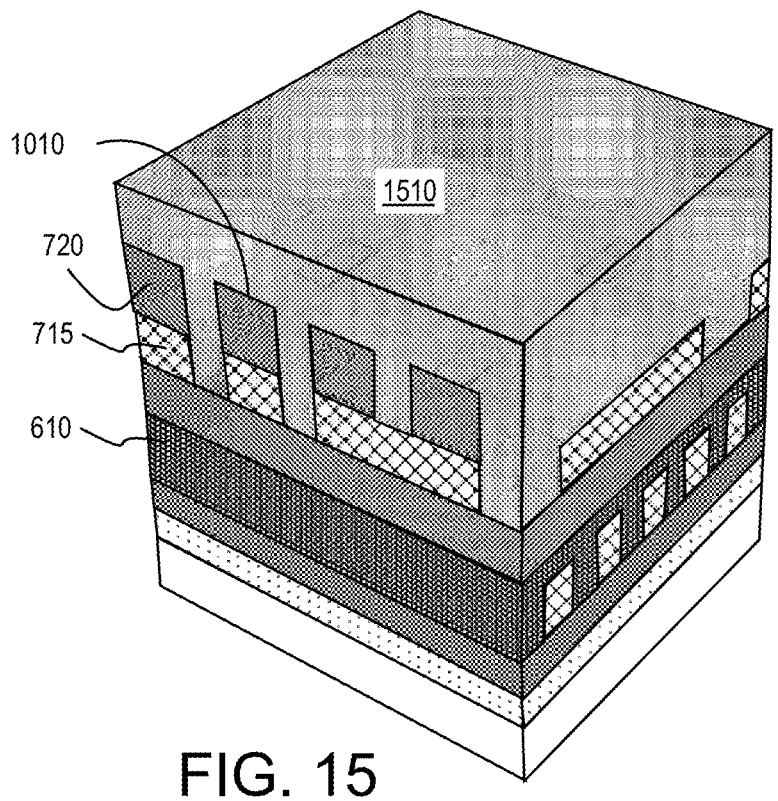
Figure 16:
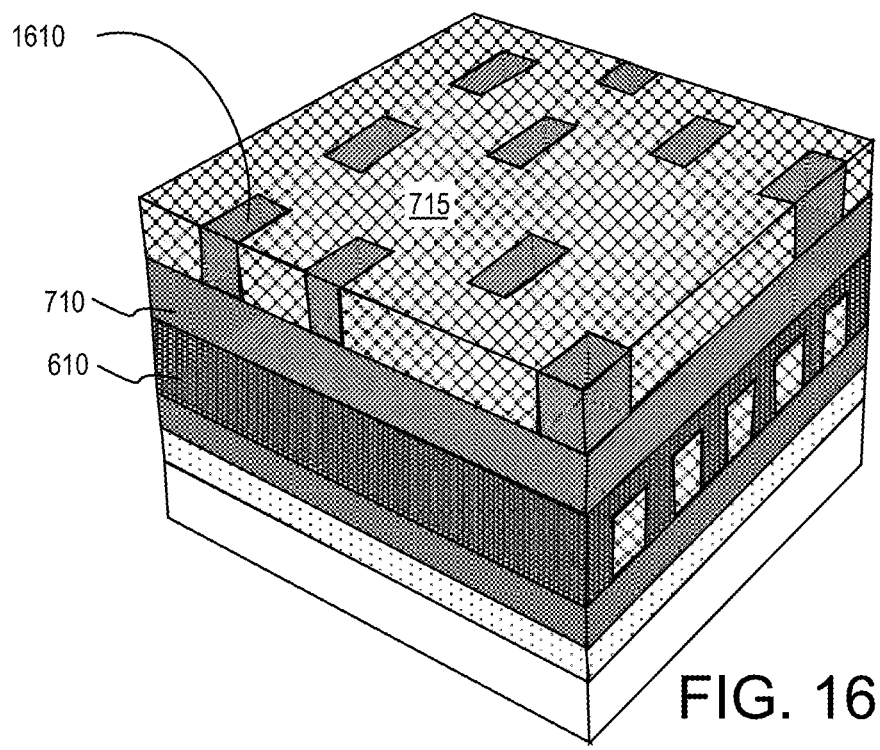

Returning to FIG. 2B, methods 202 continue at operation 230 where upper-level masking material is deposited over the second grating pattern comprising the backbone mask lines and the lines of mask backfill material. The upper-level masking material will be employed to form a plug selection pattern. The plug selection pattern may be printed at operation 235 using relaxed geometries in reliance on the underlying grating patterns having a cumulative effect as the masking levels are translated back down toward the trench ILD layer. FIG. 13 further illustrates exemplary upper-level mask material 1305 that includes a stack of (hard)mask materials 1310 and 1315 disposed over mask material 720 and mask backfill material 1010. Mask materials 1310 and 1315 may each be a dielectric material having a composition distinct from the compositions of the layers each interfaces. For example, mask material 1310 has a different composition than mask material 1315, and is also different than materials 720 and 1010 (which may be the same, for example). Mask material 1310 may be any of SiN, SiNC, SiC, SiON, SiO, SiOC, HSQ, MSQ, Si, Ge, Ti, TiN, HfOx, ZrOx, AlOx, TiOx, or metal silicate, for example. Mask material 1315 may be an adhesion layer, anti-reflective layer, etc. In some advantageous embodiments, mask material 1310 has the same composition as mask material 610. In some such embodiments, mask materials 610 and 1310 are DLC, Si-DLC, or any other known CHM/SOC composition. In some further embodiments, the mask materials 1310 and 1315 are both formed by spin-on, CVD, ALD, or other low-temperature deposition process. A photosensitive mask material 1320 (e.g., photoresist) is lithographically patterned into a plug selection mask that includes openings 1325. Openings 1325 may be relaxed relative to grating pitch $P_2$ and line spacing width $CD_2$. For example, in some embodiments a minimum critical dimension of opening 1325 may be larger than pitch $P_2$, and even as large as the width of a line of mask material 720 added to the width of a line of mask material 1010 added to the intervening space of width $CD_2$.

Returning to FIG. 2B, methods 202 continue at operation 240 where a composite of the plug selection mask and the second grating pattern (itself being a composite of the backbone and backfill material lines) is translated into a pattern accumulation layer, which may ultimately define locations for dielectric plugs. Translation of the summation of the plug selection mask and the second grating pattern may be with any suitable anisotropic etching process, referred to herein as a "plug keep" etch. An example of an IC interconnect structure following the plug keep etch is further illustrated in FIG. 14. As shown, mask material 715 is etched through only at locations that were not protected by either photosensitive mask material 1320 or mask materials 720 and 1010. Mask material 715 therefore accumulates the patterns of both the second grating and the plug selection mask.

Figure 17:
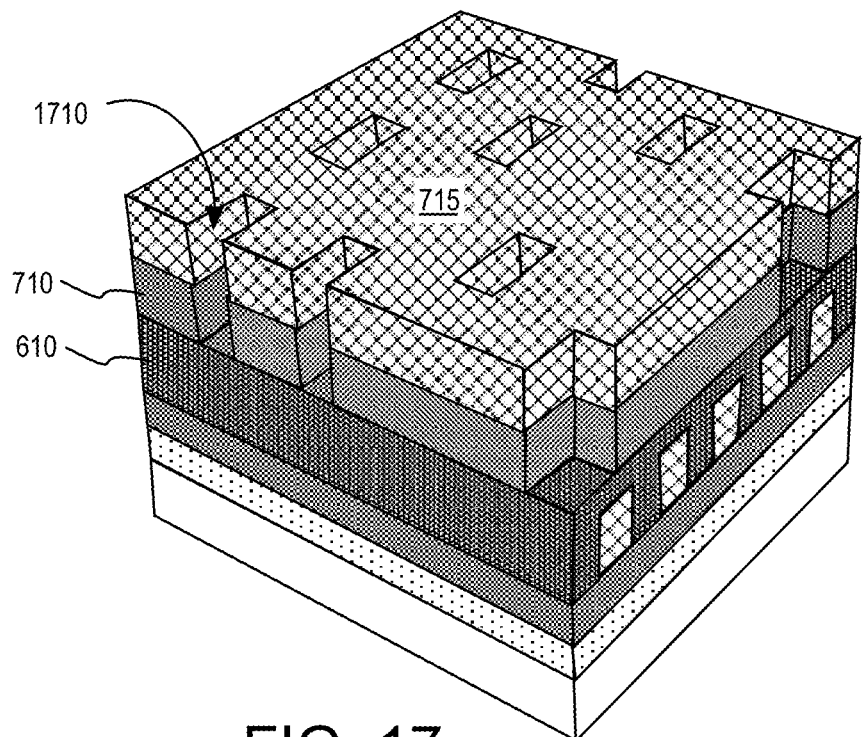
Figure 18:
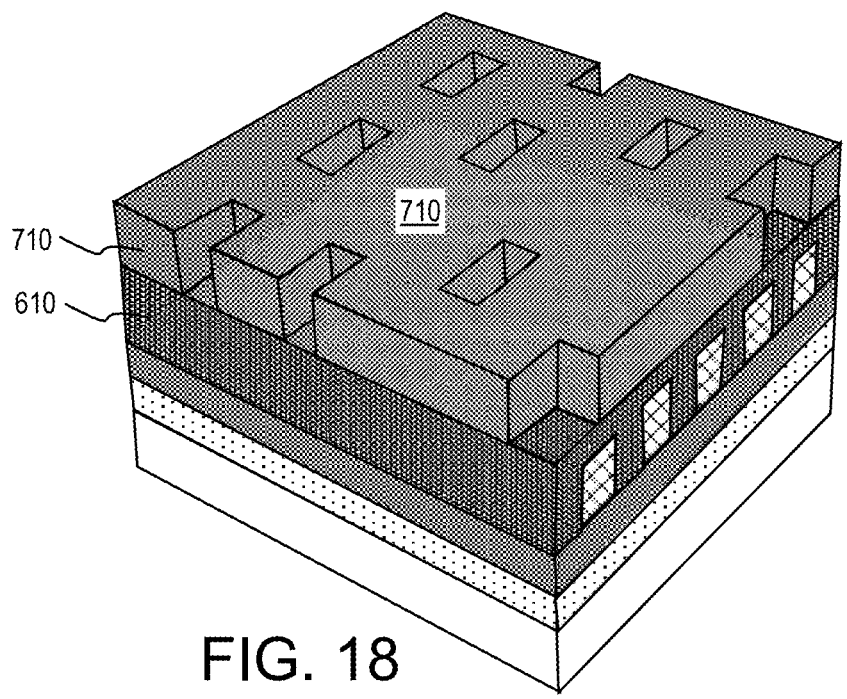

Returning to FIG. 2B, methods 202 continue at operation 245 where the plug keep pattern defined in the pattern accumulation layer is backfilled with another masking material that is then planarized and recessed to define individual or separate plugs or plug masks. For some embodiments exemplified in FIG. 15, mask backfill material 1510 is deposited over mask material 720, backfilling the openings defined in mask material 720. Mask backfill material 1510 may have the same or different composition as mask materials 720 and/or 1010. For example, mask backfill material 1510 may be any of SiN, SiNC, SiC, SiON, SiO, SiOC, HSQ, MSQ, Si, Ge, Ti, TiN, HfOx, ZrOx, AlOx, TiOx, or metal silicate, or any known CHM/SOC composition, for example. Mask backfill material 1510 is then planarized and/or recessed, removing mask material 720 and stopping on mask material 715 that is now backfilled with dielectric plugs 1610. Dielectric plugs 1610 may then be recess etched selectively to mask material 715 in the exemplary embodiments where their respective compositions afford etch selectivity. In the embodiment further illustrated in FIG. 17, mask material 715 has the same composition as dielectric plugs 1610 (mask backfill material 1510) so that the plug recess etch stops selectively on mask material 610. With the plug recesses 1710 translated down, mask layer 715 may be selectively stripped, as shown in FIG. 18. Notably, mask layer 710 at this point has the same plug keep pattern that was first formed in mask layer 715. As such, the examples shown in FIGS. 17 and 18 are optional and may be performed as needed (e.g., to switch mask material compositions as the plug keep pattern is translated from intermediate-level mask materials into lower-level mask materials).

Figure 19:
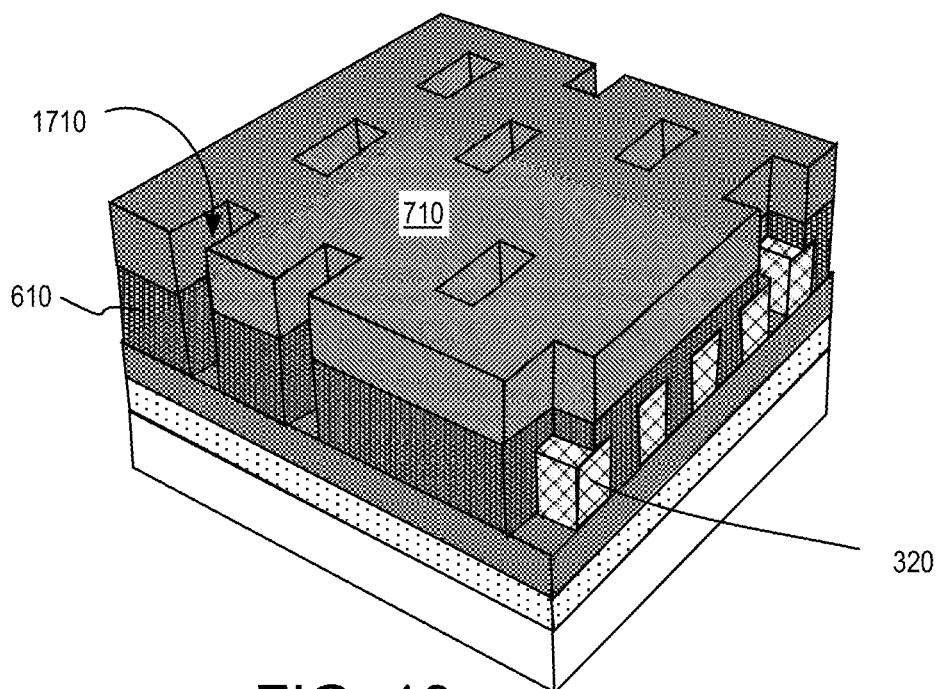
Figure 20:
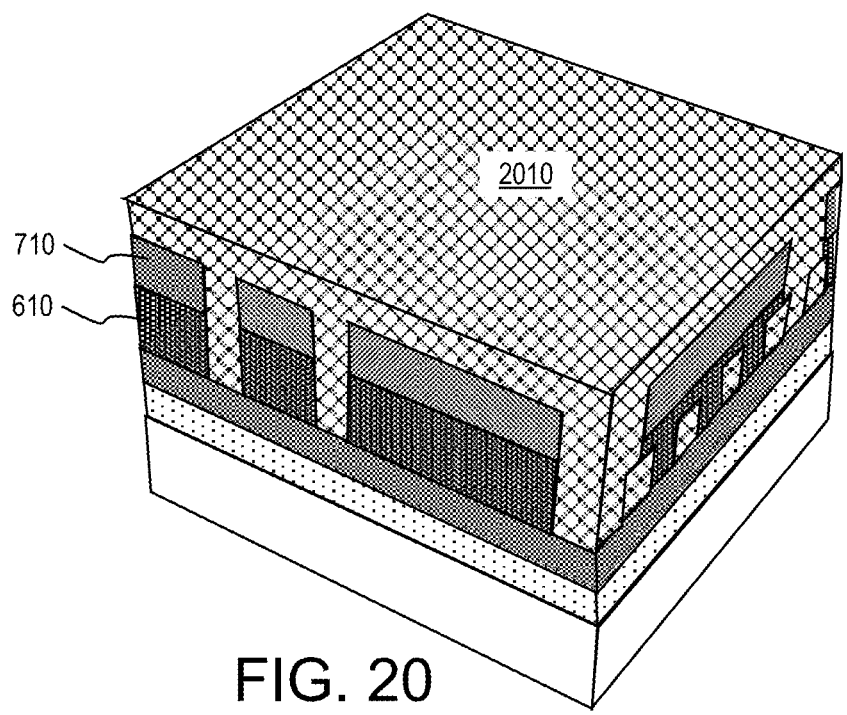
Figure 21:
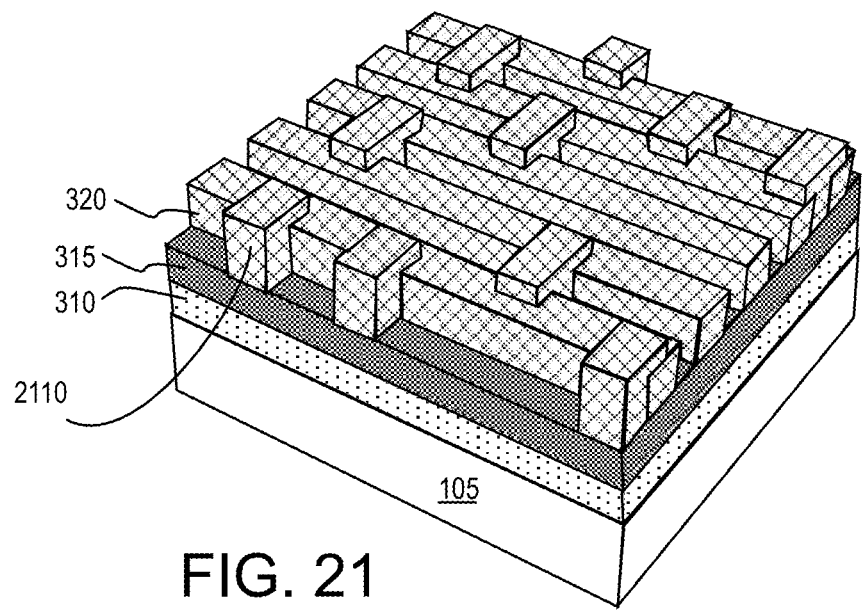
Figure 22:
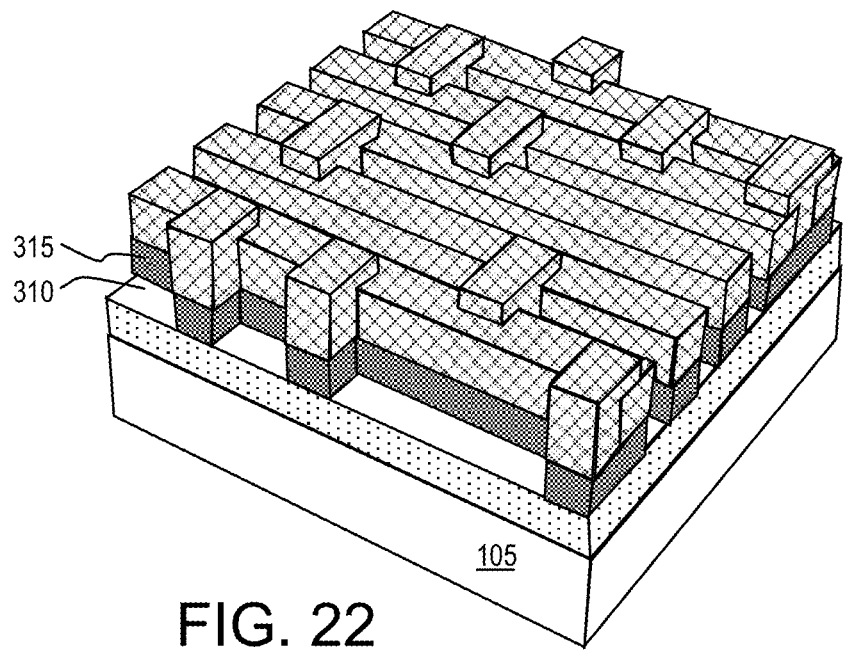
Figure 23:
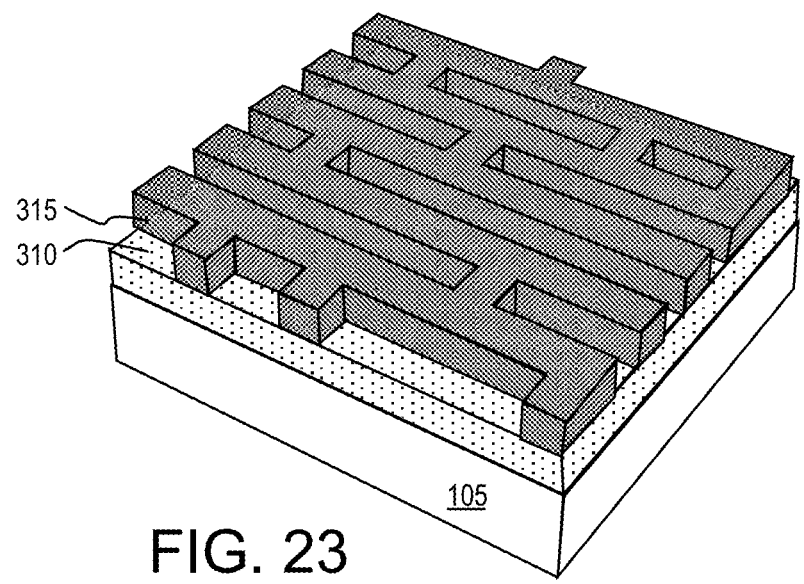
Figure 24:
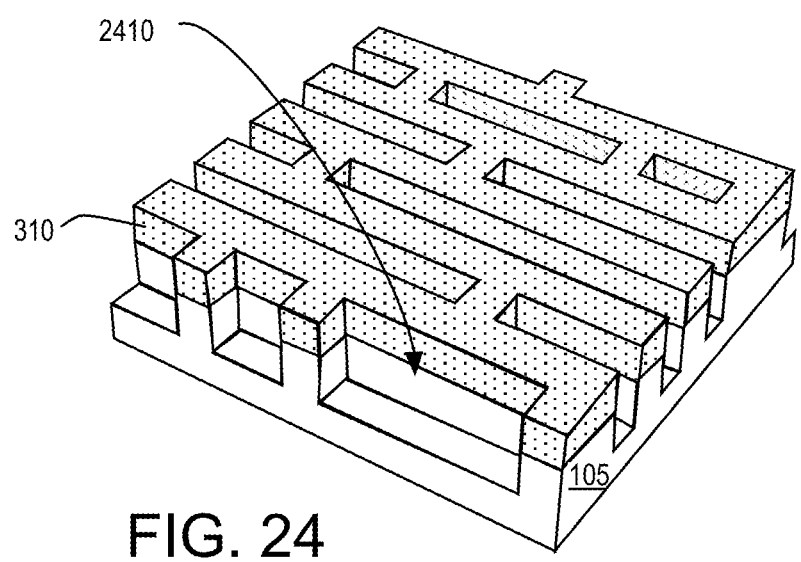
Figure 25:
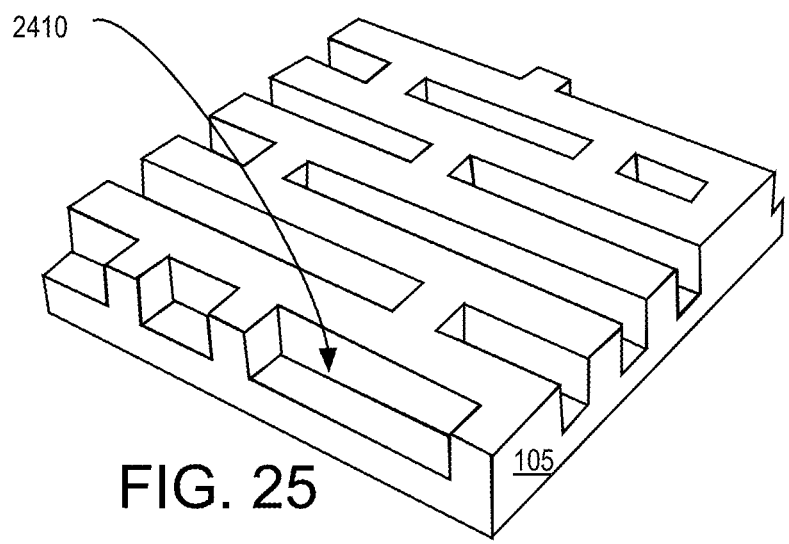

Returning to FIG. 2B, methods 202 continue at operation 250 where a composite of the plug pattern and first grating pattern is translated into an underlying pattern accumulation layer, for example with another anisotropic dielectric etch process referred to herein as the "trench plug opening" etch. FIG. 19 further illustrates an exemplary trench plug opening etch that deepens the plug recesses by removing mask material 610 only in regions where the plug recesses 1710 don't overlay the first grating pattern comprising mask material 320. Mask material 320 therefore partially masks the plug recess etching, further confining recesses 1710 to only the spaces between adjacent lines mask material 320. The trench plug openings may then be backfilled with a mask backfill material 2010, for example as further shown in FIG. 20. Mask backfill material 2010 may have the same or a different composition than mask material 320. Mask backfill material 2010 advantageously has a different composition than mask material 610. For example, mask backfill material 2010 may be any of SiN, SiNC, SiC, SiON, SiO, SiOC, HSQ, MSQ, Si, Ge, Ti, TiN, HfOx, ZrOx, AlOx, TiOx, or metal silicate, while mask material 610 is DLC, Si-DLC, or any other known CHM/SOC composition (or vice versa). Mask backfill material 1510 is then planarized and/or recess etched to form separate, individual plugs and also re-expose mask material 710, which can then be selectively stripped away. Mask material 610 may be similarly stripped away to arrive at the structure illustrated in FIG. 21. As shown, dielectric plugs 2110 intersect the first grating pattern comprising lines of mask material 320. Plugs 2110 therefore fill the spaces between lines of mask material 320 at the plug keep locations. In this exemplary embodiment, plugs 2110 are of the same dielectric composition as mask material 320 such that the trench is defined within a dielectric of a single homogenous composition. In alternative embodiments, plugs 2110 and mask material 320 have different compositions.

It should be appreciated that plugs 2110, in conjunction with mask material 320, may now be employed as a pattern accumulation layer that can be translated by an anisotropic etch to an underlying trench ILD layer. Alternatively, plugs 2110 in conjunction with mask material 320 may be employed as a trench ILD layer which is backfilled with conductive material and planarized down until the backfilled conductive material is confined within the trenches defined by plugs 2110 and mask material 320. Such a process may be readily identified by the interconnect structure where plugs 2110 are of a different dielectric composition than mask material 320.

Methods 202 further illustrate embodiments where the plugs 2110 in conjunction with mask material 320 are employed as a lower pattern accumulation layer that is translated by an anisotropic etch at operation 255 to an underlying trench ILD layer that is subsequently backfilled with metallization at operation 260. FIG. 22-25 further illustrate an anisotropic etch process that successively removes portions of lower-level masking materials 315 and 310 that are not protected by plugs 2110 or mask material 320. Trenches 2410 are then etched into trench ILD 105. The plugs 2110, in conjunction with mask material 320, thus dictate the dimensions of trenches 2410.

Figure 26:
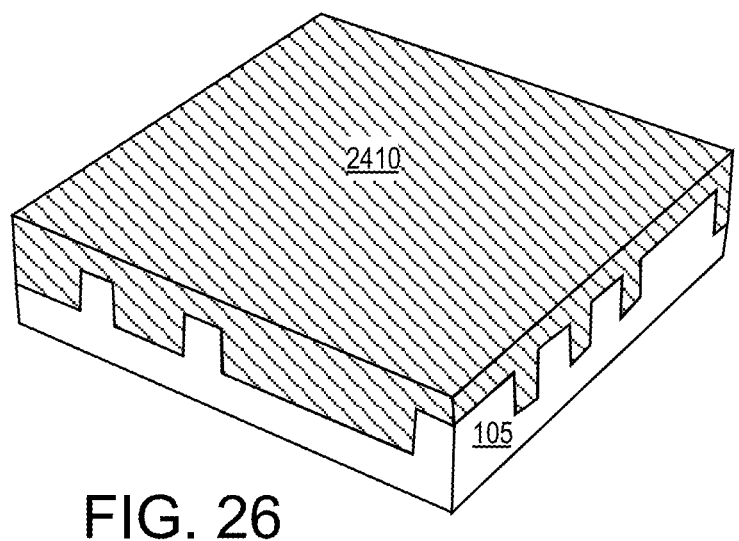
Figure 27:
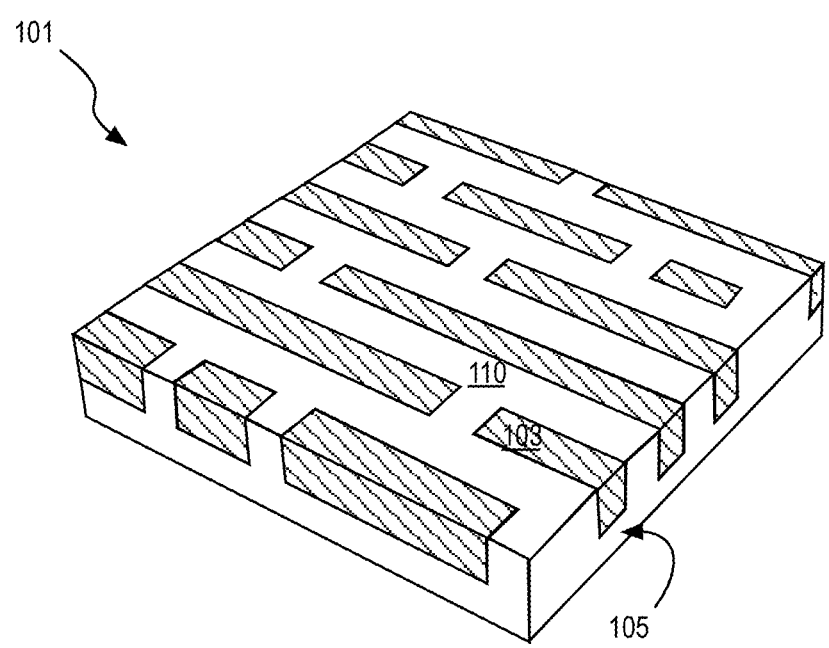

If desired, via patterning masks may be introduced and one or more via etch process employed to further delineate via openings within portions of the trenches formed in trench ILD 105. If vias openings are formed, a dual damascene-type metallization process is subsequently performed using any known technique compatible with the structure illustrated in FIG. 25. If not, a damascene-type metallization process is performed after arriving at the structure illustrated in FIG. 25. For example, as shown in FIG. 26, a conductive material 2610 (e.g., metal such as, but not limited to Cu or Al alloys) is backfilled into trenches 2410. Conductive material 2610 is then further planarized with a top surface of trench ILD 105 to arrive at the interconnect structure of IC cell 101, introduced above in the context of FIG. 1.

In view of the above description, it will be appreciated that the technique of forming dielectric plugs and conductive traces in a manner that dimensionally scales geometries of an IC interconnect structure may be readily applied one or more times in an IC fabrication process, for example at one or more interconnect levels.

Figure 28:
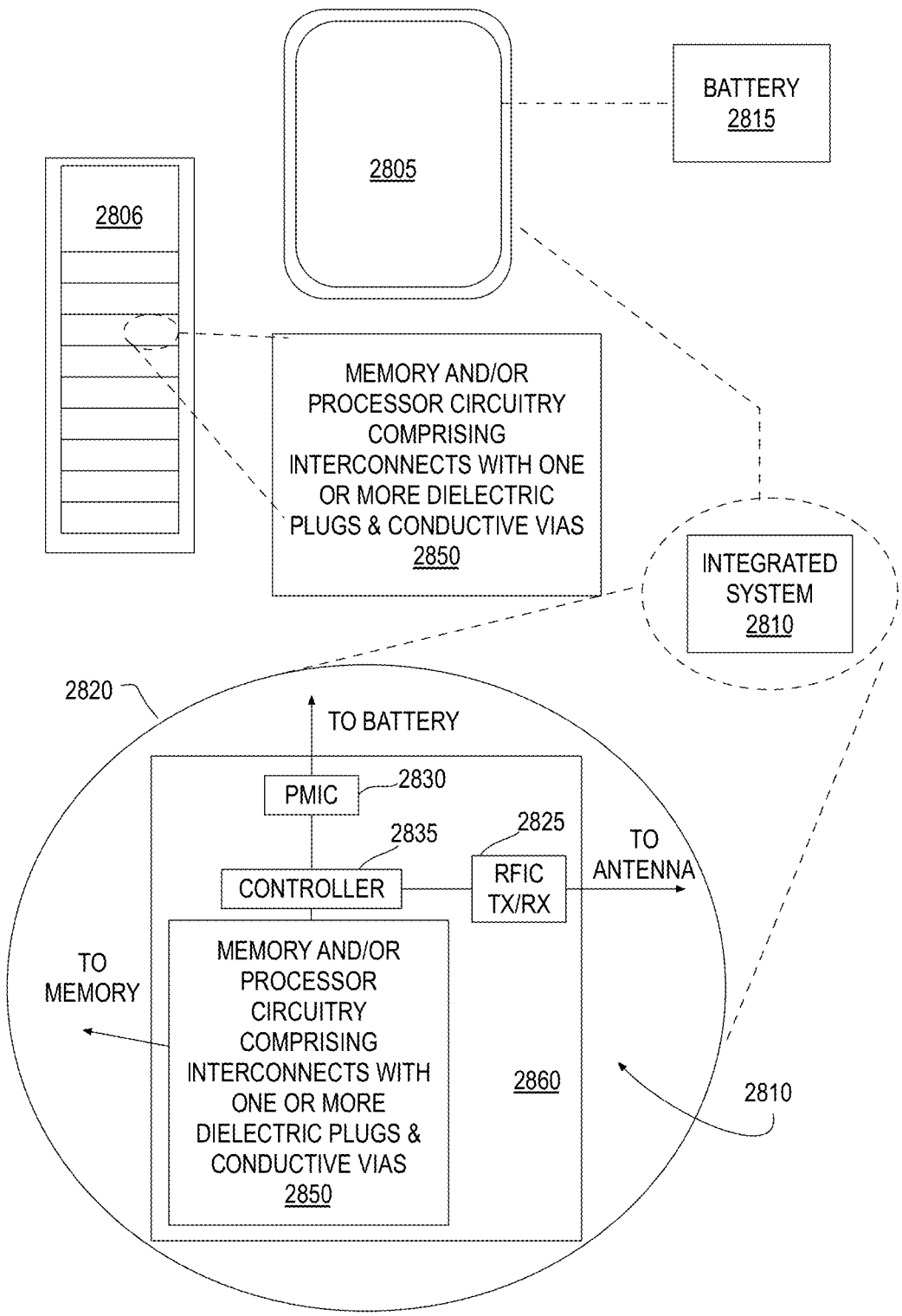
FIG. 28 illustrates a mobile computing platform and a data server machine employing an IC including and dielectric plug and conductive traces, in accordance with some embodiments.

FIG. 28 illustrates a mobile computing platform and a data server machine employing an IC including dimensionally scaled dual-damascene interconnect structures, for example having plugged conductive traces with one or more dielectric plugs in accordance with embodiments described herein. The server machine 2806 may be any commercial server, for example including any number of high-performance computing platforms disposed within a rack and networked together for electronic data processing, which in the exemplary embodiment includes a packaged monolithic SoC 2850. The mobile computing platform 2805 may be any portable device configured for each of electronic data display, electronic data processing, wireless electronic data transmission, or the like. For example, the mobile computing platform 2805 may be any of a tablet, a smart phone, laptop computer, etc., and may include a display screen (e.g., a capacitive, inductive, resistive, or optical touchscreen), a chip-level or package-level integrated system 2810, and a battery 2815.

Either disposed within the integrated system 2810 illustrated in the expanded view 2820, or as a stand-alone packaged chip within the server machine 2806, monolithic SoC 2850 includes a memory block (e.g., RAM), or a processor block (e.g., a microprocessor, a multi-core microprocessor, graphics processor, or the like) including dimensionally scaled interconnect structures having plugged conductive traces with one or more dielectric plugs, for example in accordance with embodiments described herein. The monolithic SoC 2850 may be further coupled to a board, a substrate, or an interposer 2860 along with, one or more of a power management integrated circuit (PMIC) 2830, RF (wireless) integrated circuit (RFIC) 2825 including a wideband RF (wireless) transmitter and/or receiver (TX/RX) (e.g., including a digital baseband and an analog front end module further comprises a power amplifier on a transmit path and a low noise amplifier on a receive path), and a controller 2835. Any or all of RFIC 2825 and PMIC 2830 may also include dimensionally scaled interconnect structures having plugged conductive traces with one or more dielectric plugs, for example in accordance with embodiments described herein.

Functionally, PMIC 2830 may perform battery power regulation, DC-to-DC conversion, etc., and so has an input coupled to battery 2815 and with an output providing a current supply to other functional modules. As further illustrated, in the exemplary embodiment, RFIC 2825 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 2850.

Figure 29:
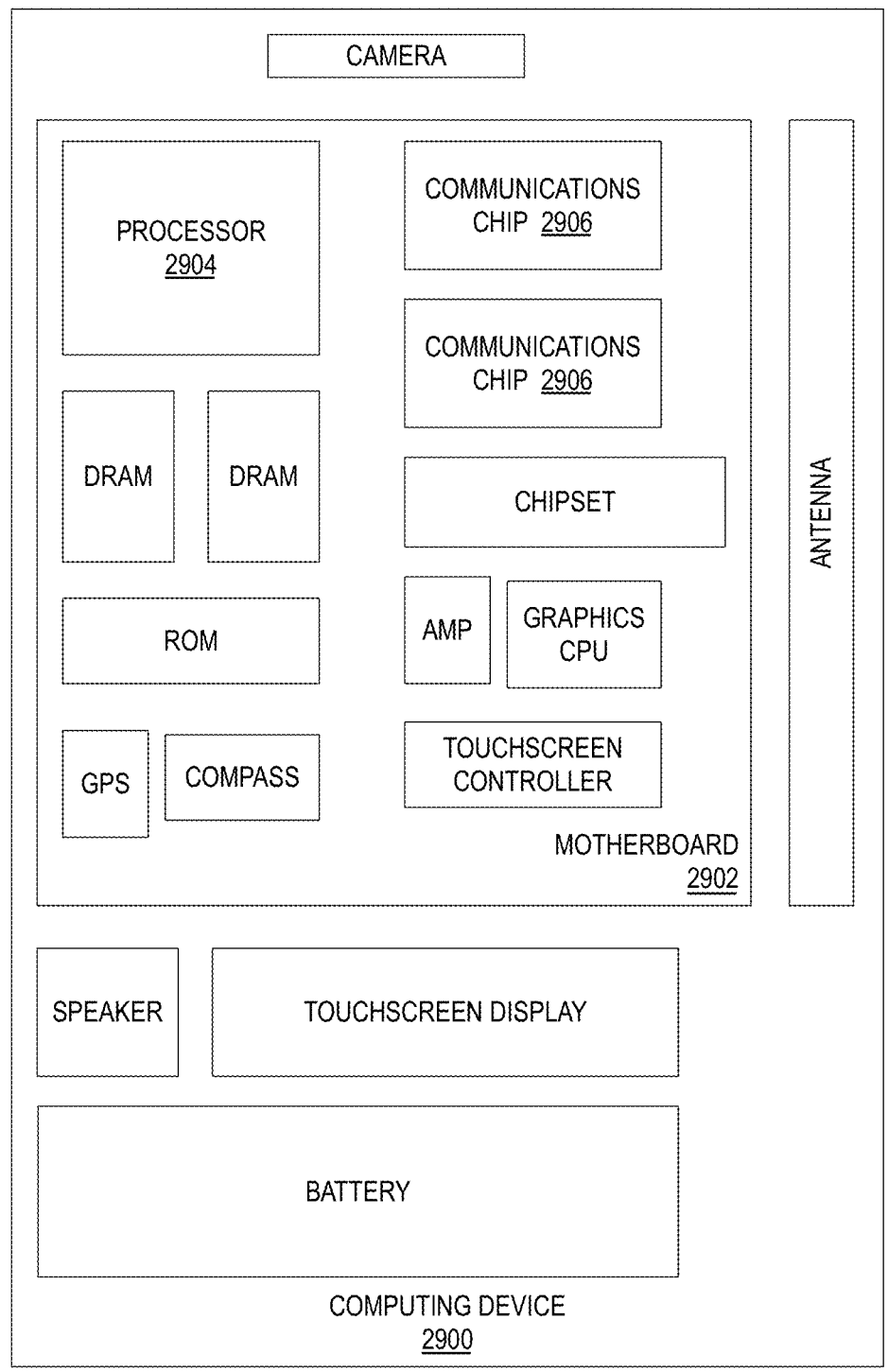
FIG. 29 is a functional block diagram of an electronic computing device, in accordance with some embodiments.

FIG. 29 is a functional block diagram of an electronic computing device, in accordance with some embodiments. Computing device 2900 may be found inside platform 2905 or server machine 2906, for example. Device 2900 further includes a motherboard 2902 hosting a number of components, such as, but not limited to, a processor 2904 (e.g., an applications processor), which may further incorporate dimensionally scaled interconnect structures having plugged conductive traces with one or more dielectric plugs, for example in accordance with embodiments described herein. Processor 2904 may be physically and/or electrically coupled to motherboard 2902. In some examples, processor 2904 includes an integrated circuit die packaged within the processor 2904. In general, the term "processor" or "microprocessor" may refer to any device or portion of a device that processes electronic data from registers and/or memory to transform that electronic data into other electronic data that may be further stored in registers and/or memory.

In various examples, one or more communication chips 2906 may also be physically and/or electrically coupled to the motherboard 2902. In further implementations, communication chips 2906 may be part of processor 2904. Depending on its applications, computing device 2900 may include other components that may or may not be physically and electrically coupled to motherboard 2902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 2906 may enable wireless communications for the transfer of data to and from the computing device 2900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 2906 may implement any of a number of wireless standards or protocols, including but not limited to those described elsewhere herein. As discussed, computing device 2900 may include a plurality of communication chips 2906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, a method of fabricating an integrated circuit (IC) interconnect structure, the method comprises forming first material lines extending lengthwise in a first direction over a substrate, forming over the first material lines second dielectric lines extending lengthwise in a second direction orthogonal to the first direction, forming a plug selection mask over the second material lines, etching openings in a pattern accumulation layer disposed over the first material lines at locations that are not protected by either the plug selection mask or the second material lines, forming dielectric plugs at locations of the openings in the pattern accumulation layer, defining trenches based on the first material lines and the dielectric plugs, and backfilling conductive material into the trenches.

In second examples, for any of the first examples, defining trenches based on the first material lines and the plugs further comprises etching portions of a trench ILD layer of the substrate that are not protected by either the plugs or the first material lines.

In third examples, for any of the first or second examples, forming the dielectric plugs further comprises depositing the dielectric plugs within spaces between the first material lines to define ends of the trenches.

In fourth examples, for any of the first, second or third examples forming the first material lines further comprises lithographically patterning a first backbone grating pattern comprising mask lines extending lengthwise in the first direction, depositing a first spacer material over the first backbone pattern, and anisotropically etching the first spacer material into the first material lines.

In fifth examples, for any of the first, second, third, or fourth examples forming the second material lines further comprises depositing intermediate-level masking material over the first material lines, lithographically patterning a second backbone pattern into a layer of the intermediate masking material, the second backbone pattern comprising material lines extending lengthwise in the second direction, depositing a second spacer material over the second backbone pattern, anisotropically etching the second spacer material into mandrel spacer lines, backfilling open spaces between the mandrel spacer lines with a mask backfill material, and forming the second material lines by removing the mandrel spacer lines selectively from the mask backfill material.

In sixth examples, for any of the first, second third, fourth, or fifth examples removing the mandrel spacer lines selectively from the mask backfill material also removes the mandrel spacer lines selectively from the second backbone pattern, and the second material lines include both the second backbone pattern and the mask backfill material.

In seventh examples, for any of the first, second third, fourth, fifth, or sixth examples, forming the plug selection mask further comprises depositing upper-level masking material over the second material lines, and lithographically defining the plug selection mask into a layer of the upper masking material.

In eighth examples, for any of the first, second third, fourth, fifth, sixth or seventh examples, forming the plug masks located at the openings in the pattern accumulation layer further comprises depositing plug mask material within spaces between the first material lines in alignment with the openings in the pattern accumulation layer.

In ninth examples, for any of the first, second third, fourth, fifth, sixth, seventh, or eighth examples, forming the plug masks further comprises translating the openings in the pattern accumulation layer into a lower-level masking material disposed between the pattern accumulation layer and the first material lines to expose portions of the first material lines and spaces there between, depositing the plug mask material onto the exposed portion of the first material lines, backfilling the spaces there between, and planarizing the plug mask material with the lower level masking material to define individual plug masks.

In tenth examples, for any of the first, second third, fourth, fifth, sixth, seventh, eighth, or ninth examples, etching portions of the trench ILD layer that are not protected by either the plug masks or the first material lines further comprises etching openings through a second pattern accumulation layer disposed between the first material lines and the trench ILD layer, removing the plug masks and first material lines from the second pattern accumulation layer, and etching portions of the trench ILD layer that are not protected by the second pattern accumulation layer.

In eleventh examples, for any of the first, second third, fourth, fifth, sixth, seventh, eighth, ninth, or tenth examples, backfilling the trench ILD layer with conductive material further comprises removing the pattern accumulation layer from the trench ILD layer, depositing metal over the trench ILD layer, and forming isolated conductive traces by planarizing a top surface of the metal with the trench ILD layer.

In twelfth examples, for any of the first, second third, fourth, fifth, sixth, seventh, eighth, ninth, tenth or eleventh examples, the conductive traces have a width and a pitch in the second direction that are equal to a width and a pitch of ILD plugs in the second direction separating ends of adjacent ones of the conductive traces.

In thirteenth examples, for any of the first, second third, fourth, fifth, sixth, seventh, eighth, ninth, tenth, eleventh, or twelfth examples the ILD plugs form a 2D rectangular grid over an area of the IC.

In fourteenth examples, an integrated circuit (IC), comprises a plurality of conductive traces disposed over a substrate and extending lengthwise in a first direction, the conductive traces having a first width and a first pitch in a second direction, orthogonal to the first, and a plurality of dielectric material plugs separating ends of adjacent ones of the conductive traces, the plugs having a second width and a second pitch in the second direction, wherein the plugs form a 2D regular rectangular grid over an area of the IC.

In fifteenth examples, for any of the fourteenth examples, the first pitch is equal to the second pitch and the first width is equal to the second width to form a regular square grid of plugs.

In sixteenth examples, for any of the fourteenth or fifteenth examples, the plugs are square, having a third width and third pitch in the first direction, the third width being equal to the first and second widths, and the third pitch being equal to the first and second pitches.

In seventeenth examples, for any of the fourteenth, fifteenth, or sixteenth examples lengths of the conductive traces are separated by a dielectric material of a first composition and the dielectric material plugs have a second composition, distinct from the first composition.

In eighteenth examples, for any of the fourteenth, fifteenth, sixteenth, or seventeenth examples the conductive traces are embedded in a dielectric material of a single homogenous composition.

In nineteenth examples, a mask stack for formation of an ends of conductive traces in an interconnect level of an integrated circuit (IC) comprises a first patterned mask material above an underlying substrate layer, the first patterned mask material having a first grating pattern with mask lines extending lengthwise a first direction, a second patterned mask material above the first patterned mask material, the second patterned mask material having a second grating pattern with lines extending lengthwise in a second direction orthogonal to the first direction, and a third patterned mask material above the second patterned mask material, the third patterned mask material having a third pattern that along with the second grating pattern, and the third grating pattern, define end locations for the metal traces.

In twentieth examples, for any of the nineteenth examples, the first patterned mask material, second patterned mask material and third patterned mask material when summed together define open regions where the masks do not overlap, and these open regions define the end locations for the conductive traces.

In twenty-first examples the first grating pattern defines widths of the conductive traces, and a summation of the second grating pattern and the third pattern define openings that define the end locations of the conductive traces for those portions of the openings that do not overlap the first grating pattern.

In twenty-second examples, a mobile computing device, comprising a battery, an antenna for wireless communication, and the IC of any one of the fourteenth, fifteenth, sixteenth, seventeenth, or eighteenth examples coupled to at least the battery and the antenna In twenty-third examples, a computing platform comprises an electronic memory, and a microprocessor communicatively coupled to at least the memory, wherein the microprocessor comprises the integrated circuit recited in any one of the fourteenth, fifteenth, sixteenth, seventeenth, or eighteenth examples.

However, the above exemplary embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An integrated circuit (IC), comprising:
    three or more coplanar conductive traces over a substrate and extending lengthwise in a first direction, the conductive traces having a first width and a first pitch in a second direction, orthogonal to the first direction; and
    three or more dielectric plugs separating ends of adjacent ones of the conductive traces, the dielectric plugs coplanar with the conductive traces and having a second width and a second pitch in the second direction, wherein the dielectric plugs are located at points on a 2D regular rectangular grid within an area of the IC.

2. The IC of claim 1, wherein the first pitch is an integer multiple of the second pitch, and the first width is equal to the second width.

3. The IC of claim 2, wherein the first pitch is equal to the second pitch.

4. The IC of claim 3, wherein the plugs are square, having a third width and third pitch in the first direction, the third width being equal to the first and second widths, and the third pitch being equal to the first and second pitches.

5. The IC of claim 1, wherein lengths of the conductive traces are separated by a dielectric material equal to a first line space width in the second direction and the plugs have a third width in the first direction that is substantially equal to the first line space width.

6. The IC of claim 5, wherein the first line space width is equal to one-half the first pitch.

7. The IC of claim 1, wherein the conductive traces extend lengthwise by at least a distance equal to the first width.

8. The IC of claim 1, wherein lengths of the conductive traces are separated by a dielectric material of a first composition and the dielectric plugs have a second composition, distinct from the first composition.

9. The IC of claim 1, wherein the conductive traces are embedded in a dielectric material of a single homogenous composition.

10. The IC of claim 9, wherein there is a discontinuity in microstructure at a perimeter of the dielectric plugs.

11. The IC of claim 1, wherein the substrate comprising a plurality of transistors interconnected to the conductive traces.

12. The IC of claim 1, wherein the dielectric plugs comprise a portion of a dielectric material that is also between adjacent lengths of the conductive traces.

13. The IC of claim 1, wherein the dielectric plugs are contiguous with a dielectric material that is below a bottom of each of the conductive traces.

14. A system, comprising:
    a battery;
    an antenna for wireless communication; and
    an integrated circuit (IC) coupled to at least the battery and the antenna, wherein the IC comprises:
        a substrate comprising a plurality of field effect transistors; and
        three or more conductive traces over a substrate and extending lengthwise in a first direction, the conductive traces having a first width and a first pitch in a second direction, orthogonal to the first direction; and
        three or more dielectric plugs separating ends of adjacent ones of the conductive traces, the plugs having a second width and a second pitch in the second direction, wherein:
            the first pitch is equal to the second pitch; and
            the plugs are square, having a third width and third pitch in the first direction, the third width being equal to the first and second widths, and the third pitch being equal to the first and second pitches.

15. The system of claim 14, wherein the plugs are located at points on a 2D regular rectangular grid within an area of the IC.

16. The system of claim 14, wherein the IC comprises a microprocessor.

17. An apparatus, comprising:
    a substrate comprising a plurality of field effect transistors; and
    three or more conductive traces over a substrate and extending lengthwise in a first direction, the conductive traces having a first width and a first pitch in a second direction, orthogonal to the first direction; and
    three or more dielectric plugs separating ends of adjacent ones of the conductive traces, the plugs having a second width and a second pitch in the second direction, wherein:
        the first pitch is equal to the second pitch; and
        the plugs are square, having a third width and third pitch in the first direction, the third width being equal to the first and second widths, and the third pitch being equal to the first and second pitches.

18. The apparatus of claim 17, wherein the dielectric plugs comprise a portion of a dielectric material that coplanar with, and between adjacent lengths of, the conductive traces.

19. The apparatus of claim 17, wherein the dielectric plugs are contiguous with a dielectric material that is below a bottom of each of the conductive traces.

* * * * *